US012768882B2

(12) United States Patent
Chen et al.

(10) Patent No.: US 12,768,882 B2
(45) Date of Patent: Oct. 20, 2026

(54) BUILT-IN SELF-TEST (BIST) CIRCUIT, INTEGRATED CIRCUIT DEVICE AND METHOD

(71) Applicants: TAIWAN SEMICONDUCTOR MANUFACTURING COMPANY, LTD., Hsinchu (TW); TSMC CHINA COMPANY, LIMITED, Shanghai (CN)

(72) Inventors: Huan-Neng Chen, Hsinchu (TW); Shao-Yu Li, Hsinchu (TW); CunCun Chen, Hsinchu (TW)

(73) Assignees: TAIWAN SEMICONDUCTOR MANUFACTURING COMPANY, LTD., Hsinchu (TW); TSMC CHINA COMPANY, LIMITED, Shanghai (CN)

( * ) Notice: Subject to any disclaimer, the term of this patent is extended or adjusted under 35 U.S.C. 154(b) by 155 days.

(21) Appl. No.: 18/930,085

(22) Filed: Oct. 29, 2024

(65) Prior Publication Data

US 2026/0063708 A1 Mar. 5, 2026

(30) Foreign Application Priority Data

Sep. 3, 2024 (CN) ........................ 202411231535.X

(51) Int. Cl.
*G01R 31/28* (2006.01)

(52) U.S. Cl.
CPC ................................ *G01R 31/2884* (2013.01)

(58) Field of Classification Search
None
See application file for complete search history.

(56) References Cited

U.S. PATENT DOCUMENTS

2006/0107140 A1 * 5/2006 Morioka ........... G11C 29/1201 714/724

* cited by examiner

*Primary Examiner* — Jas A Sanghera
(74) *Attorney, Agent, or Firm* — Hauptman Ham, LLP

(57) ABSTRACT

A built-in self-test (BIST) circuit includes a first switch, a first resistor, at least one first transistor, and a control circuit. The first switch, the first resistor and the at least one first transistor are coupled in series between a first power supply terminal of a first power supply voltage and an input/output (I/O) terminal of an I/O circuit. The control circuit is configured to, in a first BIST operation, close the first switch and, while the first switch is being closed, detect a first leakage current between the I/O terminal and a second power supply terminal of a second power supply voltage different from the first power supply voltage.

20 Claims, 23 Drawing Sheets

| TIEH | PAD | Q2 |
|---|---|---|
| 0 | 0 | 1 |
| 0 | 1 | 1 |
| 1 | 0 | 1 |
| 1 | 1 | 0 |

| TIEL | PAD | Q1 |
|---|---|---|
| 0 | 0 | 1 |
| 0 | 1 | 0 |
| 1 | 0 | 0 |
| 1 | 1 | 0 |

BUILT-IN SELF-TEST (BIST) CIRCUIT, INTEGRATED CIRCUIT DEVICE AND METHOD

PRIORITY CLAIM

This application claims priority to CN application No. 202411231535.X, filed Sep. 3, 2024, which is incorporated herein by reference in its entirety.

BACKGROUND

An integrated circuit (IC) device is tested for proper functionality at various times during fabrication and/or in the life cycle of the IC device. In an approach, during fabrication, a device referred to as a wafer prober is used to test each IC device on the wafer for functional defects. In another approach, a built-in self-test (BIST) circuit is included in an IC device and is configured to permit the IC device to test itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
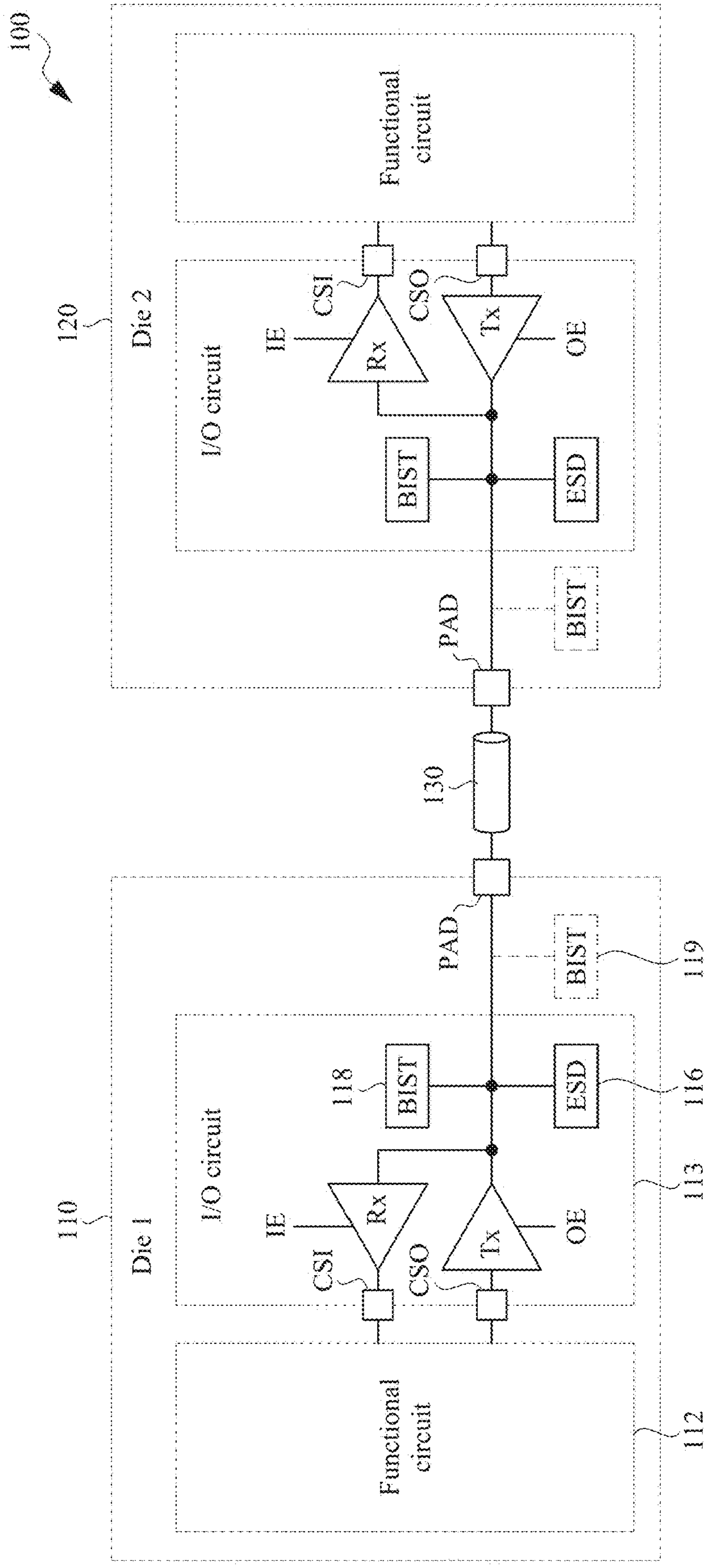
FIG. 1 is a schematic block diagram of a semiconductor device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as “beneath,” “below,” “lower,” “above,” “upper” and the like, may be used herein for case of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

IC devices are vulnerable to various potential damages, including, but not limited to, plasma induced damage (PID), electrostatic discharge (ESD) damage, or the like. A PID potentially occurs due to plasma operations during fabrication, where accumulated electrical charges on a conductive pattern or via coupled to a gate electrode of a transistor cause breakdown of the underlying gate dielectric material and damage to the transistor. ESD damages include, but are not limited to, junction damage, gate oxide damage, metallization burnout (instances of an open circuit condition), or the like. Damage to an IC device typically manifests as either a hard failure or a soft failure. In an example, a hard failure corresponds to a substantial leakage current such that a transistor is no longer functional. In a further example, a soft failure corresponds to a small leakage current such that the transistor remains functional; however, reliability and/or service life of the transistor, a circuit including the transistor, and/or an IC device including such circuit are reduced. In some situations, leakage currents in ESD-induced soft failures are of the level from nano-Amperes (nA) to micro-Amperes (μA).

In some embodiments, a BIST circuit of an IC device comprises a serial circuit configured to controllably couple an input/output (I/O) terminal of the IC device to a first power supply terminal. The serial circuit comprises a plurality of transistors coupled in series with each other and with a resistor and a switch. In a BIST operation, the switch is closed, and the serial circuit is enabled and configured as a current source of a reference current to be used for detecting a leakage current flowing to or from the I/O terminal. In response to the leakage current being larger than the reference current, a control circuit of the BIST circuit is configured to generate a signal indicative of damage to a corresponding part of the IC device. In response to the leakage current being not larger than the reference current, such a signal is not generated, and the IC device is considered or marked as passing the BIST operation.

In at least one embodiment, by including the resistor and plurality of transistors in the serial circuit, the reference current is reduced which enables the BIST circuit to detect small leakage currents corresponding to soft failures. In some embodiments, the reference current is lower than 1 μA. In one or more embodiments, the serial connection of the plurality of transistors makes it possible to reduce process-voltage-temperature (PVT) variations. In some embodiments, one or more parts of the serial circuit are controllably bypassed by a switch arrangement to vary the reference current of the BIST circuit in accordance with various BIST scenarios.

In some embodiments, the BIST circuit comprises a detection assist circuit configured to assist detection of a leakage current. Specifically, in response to a leakage current flowing between the I/O terminal and a second power supply terminal, the detection assist circuit is configured to form a current path therethrough to couple the I/O terminal to the second power supply terminal. As a result, it is possible in one or more embodiments to quickly and surely change a voltage level (or a logic state) of the I/O terminal when a leakage current occurs which, in turn, improves at least one of speed, reliability, or sensitivity of the BIST circuit. Other advantages and/or effects are achievable in one or more embodiments as described herein.

FIG. 1 is a schematic block diagram of a semiconductor device 100, in accordance with some embodiments.

The semiconductor device 100 comprises an IC device 110 (labelled in the drawing as "Die 1") and an IC device 120 (labelled in the drawing as "Die 2") electrically and/or physically coupled to each other by a die-to-die (D2D) interface structure 130. In some embodiments, the IC device 110 is an example of one of a first IC device and a second IC device, and the IC device 120 is an example of the other of the first IC device and the second IC device. In some embodiments, the IC device 110 and the IC device 120 are stacked over each other, and are physically bonded and electrically coupled to each other in a three-dimensional (3D) IC arrangement. In some embodiments, the IC device 110 and the IC device 120 are arranged side-by-side on, and physically bonded to, a further substrate, wafer, interposer, or die (not shown), and are electrically coupled to each other through the further substrate, wafer, interposer, or die, in a further 3D IC arrangement. Examples of 3D IC arrangements include, but are not limited to, CoWoS (Chip-on-Wafer-on-Substrate), InFO (Integrated Fan-Out) wafer level packaging, SoIC (System on Integrated Chips), or the like. In some embodiments, the semiconductor device 100 comprises more than two IC devices (or dies) electrically and/or physically coupled to each other. In some embodiments, the semiconductor device 100 has one die, e.g., the IC device 110, whereas the other die, e.g., the IC device 120, is omitted. In the example configuration in FIG. 1, the IC device 120 is configured similarly to the IC device 110. The IC device 110 is described in detail herein, and a detailed description of the IC device 120 is omitted.

The IC device 110 comprises one or more functional circuits and one or more input/output (I/O) circuits electrically coupled to the one or more functional circuits. In at least one embodiment, the IC device 110 comprises a plurality of I/O circuits electrically coupled to a functional circuit. In FIG. 1, a representative functional circuit 112 and a representative I/O circuit 113 of the IC device 110 are illustrated.

The functional circuit 112 is configured to perform an intended function, e.g., data processing or data storage, of the IC device 110. Examples of one or more circuits, logics, or cells included in the functional circuit 112 include, but are not limited to, AND, OR, NAND, NOR, XOR, INV, OR-AND-Invert (OAI), MUX, Flip-flop, BUFF, Latch, delay, clock, memory, or the like. The circuits, logics, or cells included in the functional circuit 112 include functional transistors or core transistors which are to be protected from potential damages, such as PIDs and/or ESD-induced damages. Examples of transistors in the functional circuit 112, as well as in the other circuits (such as the I/O circuit 113) described herein, include, but are not limited to, metal oxide semiconductor field effect transistors (MOSFETs), complementary metal oxide semiconductor (CMOS) transistors, P-channel metal-oxide semiconductor (PMOS) transistors, N-channel metal-oxide semiconductor (NMOS) transistors, bipolar junction transistors (BJTs), high voltage transistors, high frequency transistors, P-channel and/or N-channel field effect transistors (PFETs/NFETs), FinFETs, planar MOS transistors with raised source/drains, nanosheet FETs, nanowire FETs, or the like.

The I/O circuit 113 is electrically coupled to the functional circuit 112, and is configured as an interface circuit between the functional circuit 112 on the IC device 110 and external circuitry outside the IC device 110. In the example configuration in FIG. 1, the I/O circuit 113 comprises an input buffer Rx (also referred to as "receiving circuit" or "input circuit"), an output buffer Tx (also referred to as "transmitting circuit" or "output circuit"), and an electrostatic discharge (ESD) protection circuit 116. In some embodiments, the IC device 110 further comprises inside and/or outside the I/O circuit 113 one or more antenna circuits (not shown) configured as protection against PIDs.

An output of output buffer Tx is coupled at an I/O terminal PAD to an input of input buffer Rx. An input of output buffer Tx is coupled to the functional circuit 112 through a pin or node CSO (core signal output). An output of input buffer Rx is coupled to the functional circuit 112 through a pin or node CSI (core signal input). In the example configuration in FIG. 1, I/O terminal PAD is coupled by the D2D interface structure 130 to a corresponding I/O terminal PAD of a corresponding I/O circuit of the IC device 120. In some embodiments, I/O terminal PAD is coupled to an external device or circuit other than the IC device 120. Examples of the D2D interface structure 130 include, but are not limited to, through-silicon vias (TSVs), hybrid bumps, ubumps (micro bumps), or the like.

Output buffer Tx is configured to receive an output enable signal OE, e.g., from the functional circuit 112 or a control circuit (not shown) of the IC device 120. Output buffer Tx is enabled, by a first logic state of the output enable signal OE, to send an output signal of the functional circuit 112 through node CSO to I/O terminal PAD then to external circuitry (such as the IC device 120). Output buffer Tx is disabled, by a different second logic state of the output enable signal OE, from sending an output signal from node CSO to I/O terminal PAD. Input buffer Rx is configured to receive an input enable signal IE, e.g., from the functional circuit 112 or the control circuit (not shown) of the IC device 120. Input buffer Rx is enabled, by a first logic state of the input enable signal IE, to send an input signal received at I/O terminal PAD from external circuitry (e.g., the IC device 120) through node CSI to the functional circuit 112. Input buffer Rx is disabled, by a different second logic state of the input enable signal IE, from sending an input signal from I/O terminal PAD to node CSI. Sometimes, a state in which output buffer Tx or input buffer Rx is disabled is referred to as a Hi-Z (high resistance) state. Examples of signals passing through the I/O circuit 113 and I/O terminal PAD include, but are not limited to, data, power, clock, control, or the like. Examples of one or more circuits in at least one of input buffer Rx or output buffer Tx include, but are not limited to, buffers, latches, level shifters, inverters, or the like.

In an example configuration in accordance with some embodiments, when input buffer Rx or output buffer Tx is enabled, a logic state of I/O terminal PAD is similar to a logic state of the corresponding node CSI or node CSO. For example, when input buffer Rx is enabled, logic "1" at I/O terminal PAD results in logic "1" at node CSI, and logic "0" at I/O terminal PAD results in logic "0" at node CSI. For a further example, when output buffer Tx is enabled, logic "1" at node CSO results in logic "1" at I/O terminal PAD, and logic "0" at node CSO results in logic "0" at I/O terminal PAD. An example circuit of input buffer Rx or output buffer Tx for implementing the described configuration includes two inverters coupled in series. Other circuits and/or configurations are within the scopes of various embodiments.

In a normal operation mode for communication between the IC device 110 and external circuitry, one of input buffer Rx or output buffer Tx is enabled at a time. In a first example of the normal operation mode, input buffer Rx is disabled, i.e., controlled to have a Hi-Z state, and output buffer Tx is enabled to transmit an output signal from node CSO through I/O terminal PAD to external circuitry. In a second example of the normal operation mode, output buffer Tx is disabled, i.e., controlled to have a Hi-Z state, and input buffer Rx is enabled to send an input signal received from external circuitry at I/O terminal PAD to node CSI.

In a loopback mode, both of input buffer Rx and output buffer Tx are enabled. As a result, a signal output by the functional circuit 112 to node CSO is transmitted, or looped, through output buffer Tx and input buffer Rx, back to the functional circuit 112 through node CSI. Other modes of operation are within the scopes of various embodiments.

The ESD protection circuit 116 is configured to protect other circuits, including the functional circuit 112, that are electrically coupled to I/O terminal PAD from ESD events occurring on I/O terminal PAD during fabrication, operation or handling of the IC device 110 or semiconductor device 100. Examples ESD protection circuits include, but are not limited to, diodes, grounded-gate NMOS (ggNMOS) transistors, silicon-controlled rectifiers (SCRs), or the like. In some embodiments, transistors in the ESD protection circuit 116 are larger than and/or have a different configuration from the functional transistors or core transistors of the functional circuit 112 to be able to sustain and handle high voltages and/or current of ESD events.

The IC device 110 further comprises a BIST circuit. In the example configuration in FIG. 1, the IC device 110 comprises a BIST circuit 118 as part of the I/O circuit 113. In an alternative example configuration also shown in FIG. 1, the IC device 110 comprises a BIST circuit 119 outside the I/O circuit 113. In at least one embodiment, a BIST circuit of the IC device 110 has a part (or circuit) inside the I/O circuit 113 and another part (or circuit) outside the I/O circuit 113. In some embodiments, each I/O circuit of the IC device 110 comprises a separate BIST circuit. In at least one embodiment, several I/O circuits of the IC device 110 shares a common BIST circuit. The BIST circuit of the IC device 110 is configured to perform one or more BIST operations to detect various types of damage in various components of, or connected to, the IC device 110 as described herein.

Figure 2:
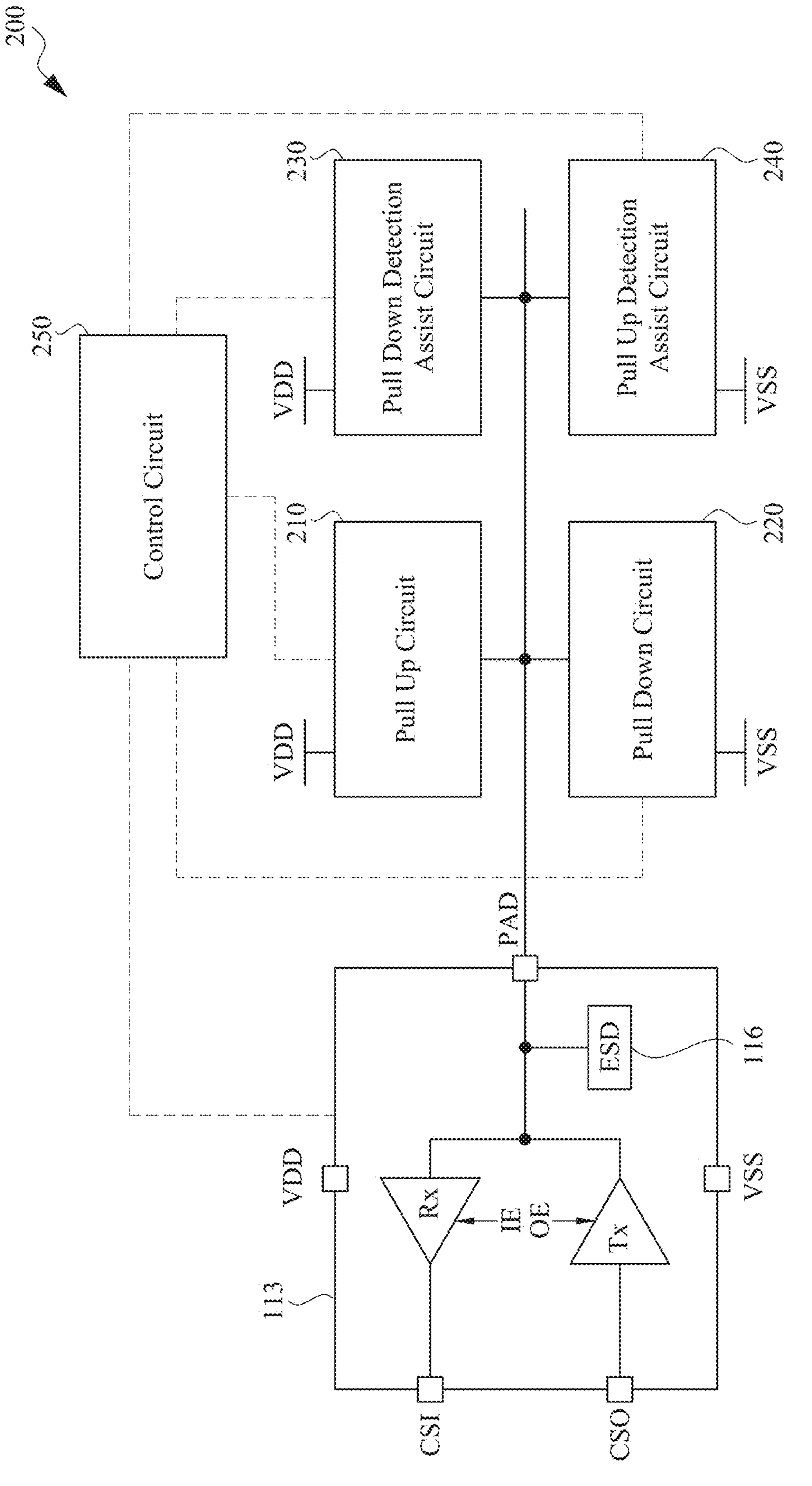
FIG. 2 is a schematic block diagram of a built-in self-test (BIST) circuit, in accordance with some embodiments.

FIG. 2 is a schematic block diagram of a built-in self-test (BIST) circuit 200, in accordance with some embodiments. In some embodiments, the BIST circuit 200 corresponds to one or more of the BIST circuits described with respect to FIG. 1. For example, the BIST circuit 200 corresponds to the BIST circuit 118 and/or BIST circuit 119, and is coupled to the I/O circuit 113.

In the example configuration in FIG. 2, the BIST circuit 200 comprises a pull-up circuit 210, a pull-down circuit 220, a pull-down detection assist circuit 230, a pull-up detection assist circuit 240, and a control circuit 250. The pull-up circuit 210 and the pull-down detection assist circuit 230 are coupled between I/O terminal PAD of the I/O circuit 113 and a power supply terminal of a positive power supply voltage, e.g., VDD. The pull-down circuit 220 and the pull-up detection assist circuit 240 are coupled between I/O terminal PAD and a power supply terminal of a reference power supply voltage lower than the positive power supply voltage. In the example configuration in FIG. 1, the reference voltage is the ground voltage VSS. Other reference voltages are within the scopes of various embodiments. For simplicity, a power supply terminal and the corresponding power supply voltage are referred to herein by the same label, e.g., VDD denotes both the positive power supply voltage and a power supply terminal of the positive power supply voltage. In some embodiments, VDD is an example of one of a first power supply terminal (first power supply voltage) and a second power supply terminal (power supply voltage), whereas VSS is an example of the other of the first power supply terminal (first power supply voltage) and the second power supply terminal (power supply voltage).

The control circuit 250 is coupled to the I/O circuit 113, pull-up circuit 210, pull-down circuit 220, pull-down detection assist circuit 230, pull-up detection assist circuit 240, and configured to control and/or cooperate with one or more of the I/O circuit 113, pull-up circuit 210, pull-down circuit 220, pull-down detection assist circuit 230, pull-up detection assist circuit 240 in various BIST operations. In an example configuration, the control circuit 250 comprises various circuits and/or logics coupled together to control and/or perform one or more BIST operations as described herein.

In an example BIST operation in accordance with some embodiments, the control circuit 250 enables the pull-up circuit 210 and pull-up detection assist circuit 240, and disables the pull-down circuit 220 and pull-down detection assist circuit 230. The pull-up circuit 210 is configured to pull a voltage of I/O terminal PAD to VDD. In some embodiments, the pull-up circuit 210 is configured to perform a weak pull as described herein. When there is damage, e.g., PID or ESD-induced damage, between I/O terminal PAD and VSS, a leakage current flows from I/O terminal PAD to VSS. When the leakage current is larger, or stronger, than the weak pull of the pull-up circuit 210, the voltage of I/O terminal PAD is decreased. When the voltage of I/O terminal PAD is decreased to a predetermined first voltage level, a logic state of node CSI is changed. By detecting such change in the logic state of node CSI, the control circuit 250 determines that damage exists between I/O terminal PAD and VSS, and outputs a signal indicative of such damage.

The pull-up detection assist circuit 240 is configured to, in response to the leakage current flowing from I/O terminal PAD to VSS, form a current path to couple I/O terminal PAD to VSS. As a result, in one or more embodiments, the voltage of I/O terminal PAD is decreased (or is pulled-down) quickly to VSS, resulting in an early change of the logic state of node CSI, and an early and reliable determination by control circuit 250 that damage exists between I/O terminal PAD and VSS. In some embodiments, the pull-up detection assist circuit 240 is omitted.

When the leakage current is not larger than the weak pull of the pull-up circuit 210, the voltage of I/O terminal PAD and the corresponding logic state of node CSI remain unchanged, and the control circuit 250 determines that no damage exists between I/O terminal PAD and VSS and indicates that the IC device 110 passes the BIST operation.

In a further example BIST operation in accordance with some embodiments, the control circuit 250 enables the pull-down circuit 220 and pull-down detection assist circuit 230, and disables the pull-up circuit 210 and pull-up detection assist circuit 240. The pull-down circuit 220 is configured to pull the voltage of I/O terminal PAD to VSS. In some embodiments, the pull-down circuit 220 is configured to perform a weak pull as described herein. When there is damage, e.g., PID or ESD-induced damage, between I/O terminal PAD and VDD, a leakage current flows from VDD to I/O terminal PAD. When the leakage current is larger, or stronger, than the weak pull of the pull-down circuit 220, the voltage of I/O terminal PAD is increased. When the voltage of I/O terminal PAD is increased to a predetermined second voltage level, a logic state of node CSI is changed. By detecting such change in the logic state of node CSI, the control circuit 250 determines that damage exists between I/O terminal PAD and VDD, and outputs a signal indicative of such damage.

The pull-down detection assist circuit 230 is configured to, in response to the leakage current flowing from VDD to I/O terminal PAD, form a current path to couple I/O terminal PAD to VDD. As a result, in one or more embodiments, the voltage of I/O terminal PAD is increased (or is pulled-up) quickly to VDD, resulting in an early change of the logic state of node CSI, and an early and reliable determination by control circuit 250 that damage exists between I/O terminal PAD and VDD. In some embodiments, the pull-down detection assist circuit 230 is omitted.

When there is no leakage current or the leakage current is not larger than the weak pull of the pull-down circuit 220, the voltage of I/O terminal PAD and the corresponding logic state of node CSI remain unchanged, and the control circuit 250 determines that no damage exists between I/O terminal PAD and VDD and indicates that the IC device 110 passes the BIST operation.

In some embodiments, at least one of the pull-up circuit 210, pull-down circuit 220, pull-down detection assist circuit 230, pull-up detection assist circuit 240, and control circuit 250 is omitted. In a first example, the pull-down circuit 220, pull-down detection assist circuit 230, pull-up detection assist circuit 240 are omitted. In a second example, the pull-up circuit 210, pull-down detection assist circuit 230, pull-up detection assist circuit 240 are omitted. In a third example, the pull-down detection assist circuit 230, pull-up detection assist circuit 240 are omitted. In a fourth example, the pull-down circuit 220, pull-down detection assist circuit 230 are omitted. In a fifth example, the pull-up circuit 210, pull-up detection assist circuit 240 are omitted. In a sixth example, the control circuit 250 is partly or wholly omitted, and the described operations of and/or control by the control circuit 250 are partly or wholly performed by a control circuit outside the BIST circuit 200. Various example configurations and/or operations of one or more of the pull-up circuit 210, pull-down circuit 220, pull-down detection assist circuit 230, pull-up detection assist circuit 240, and control circuit 250 are described herein with respect to FIGS. 3A-8C.

Figure 3A:
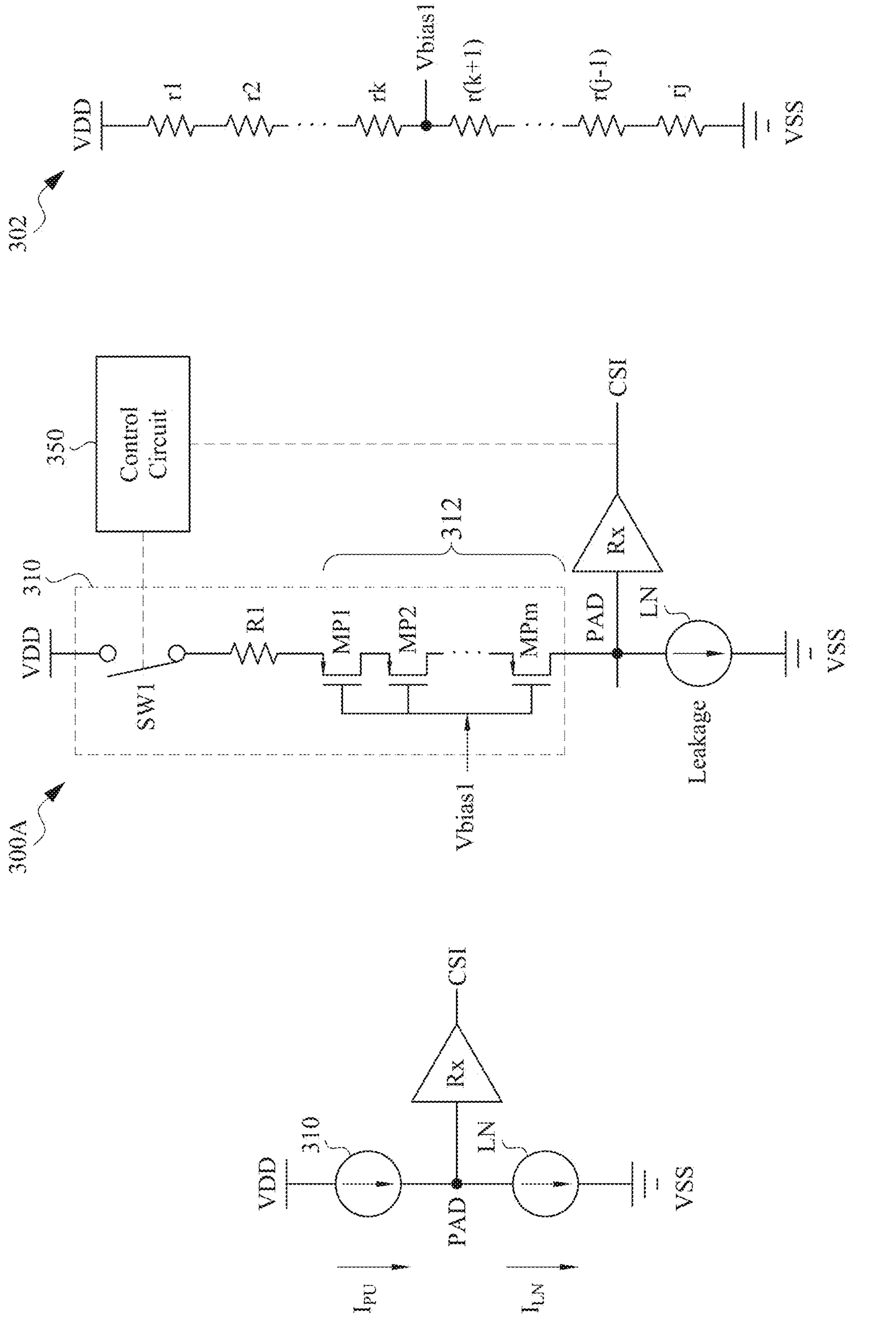
FIGS. 3A-3F are schematic circuit diagrams of various BIST circuits having pull-up circuits and/or pull-down circuits, in accordance with some embodiments.

FIG. 3A is a schematic circuit diagram of a BIST circuit 300A, in accordance with some embodiments. In some embodiments, the BIST circuit 300A corresponds to one or more BIST circuits described with respect to FIGS. 1, 2. For simplicity, corresponding components, elements or features are designated by the same reference numerals throughout the drawing figures.

The BIST circuit 300A comprises a pull-up circuit 310, and a control circuit 350. In some embodiments, the pull-up circuit 310 corresponds to the pull-up circuit 210, and/or the control circuit 350 corresponds to the control circuit 250.

The pull-up circuit 310 comprises a switch SW1, a resistor R1, and a plurality of transistors MP1, MP2 to MPm, where m is a natural number. The switch SW1, resistor R1 and transistors MP1, MP2 to MPm are coupled in series between VDD and an I/O terminal PAD of an I/O circuit as described herein. For simplicity, input buffer Rx and node CSI of the I/O circuit are illustrated in FIG. 3A, whereas other components or circuits of the I/O circuit are omitted. In at least one embodiment, the pull-up circuit 310 comprises a transistor (e.g., m=1) instead of a plurality of transistors.

The switch SW1 is coupled to the control circuit 350 which is configured to control the switch SW1 to be selectively closed in a BIST operation, and to be opened in other operations of an IC device comprising the BIST circuit 300A. In at least one embodiment, the switch SW1 comprises a transistor. Other switch configurations are within the scopes of various embodiments.

The transistors MP1, MP2 to MPm are P-type transistors, e.g., PMOS transistors. Other transistor configurations are within the scopes of various embodiments. The transistors MP1, MP2 to MPm are coupled in series into a transistor string 312 in which a drain of a transistor is coupled to a source of a subsequent transistor. For example, a drain of the transistor MP1 is coupled to a source of the subsequent transistor MP2. A source of the transistor MP1 at a first end of the transistor string 312 is coupled to an end of resistor R1. Another end of resistor R1 is coupled by the switch SW1 to VDD. A drain of the transistor MPm at a second end of the transistor string 312 is coupled to I/O terminal PAD. Gates of the transistors MP1, MP2 to MPm are coupled together and configured to receive a bias voltage Vbias1. In some embodiments, the bias voltage Vbias1 is predetermined to configure the transistors MP1, MP2 to MPm to be operable at a direct current (DC) operating point.

An example bias voltage generation circuit 302 is shown in FIG. 3A. In some embodiments, the bias voltage generation circuit 302 is a part of the BIST circuit 300A. In at least one embodiment, the bias voltage generation circuit 302 is a circuit outside the BIST circuit 300A. In the example configuration in FIG. 3A, the bias voltage generation circuit 302 is a voltage divider comprising a plurality of resistors r1, r2, . . . r(k), r(k+1) . . . r(j−1), r(j), where k and j are natural numbers and k<j. The resistors are coupled in series into a resistor string between VDD and VSS. The bias voltage Vbias1 is extracted from a point or node along the resistor string. In the example configuration in FIG. 3A, the bias voltage Vbias1 is extracted from a node between resistors r(k), r(k+1). Bias voltage generation circuits other than a voltage divider are within the scopes of various embodiments.

In at least one embodiment, resistor R1 comprises one or more resistive regions in which various conductive features, such as metal gates, source/drain contact structures, and conductors in one or more metal layers are coupled together to provide intended resistance. In some embodiments, each resistive region of resistor R1 corresponds to a resistor cell, and multiple instances of the resistor cell are placed in abutment and coupled with each other to configure multiple corresponding resistive regions of resistor R1. An example resistor cell is described with respect to FIG. 9. The described resistor configuration is sometimes referred to as middle end high resistance (ME-HiR). In some embodiments, each of the resistors in the bias voltage generation circuit 302 comprises one or more resistive regions as described with respect to resistor R1. Other resistor configurations are within the scopes of various embodiments.

The control circuit 350 is configured to control the pull-up circuit 310 to perform a BIST operation to check for N-side damage of the IC device and/or I/O circuit including the BIST circuit 300A. Such a BIST operation is sometimes referred to as an N-side checking BIST operation. In some embodiments, N-side damage includes any damage that gives rise to a leakage current between I/O terminal PAD and VSS. N-side damage potentially occurs at one or more N-type transistors or circuit elements, such as NMOS transistors included in the input buffer Rx and output buffer Tx (not shown in FIG. 3A) coupled to I/O terminal PAD.

In the N-side checking BIST operation, in accordance with some embodiments, the control circuit 350 is configured to close switch SW1, and while switch SW1 is being closed, detect a leakage current between I/O terminal PAD and VSS. In FIG. 3A, such a leakage current is schematically represented as current $I_{LN}$ of a current source LN. When no or insubstantial leakage current exists, $I_{LN}$ is zero or substantially zero. As switch SW1 is closed, I/O terminal PAD is coupled to VDD by the serial connection of resistor R1 and the transistors MP1, MP2 to MPm, a voltage of I/O terminal PAD is pulled-up to VDD, and node CSI has a corresponding logic state, e.g., logic "1". The pull-up circuit 310 with switch SW1 closed is schematically represented as a current source having a current $I_{PU}$. $I_{PU}$ corresponds to a magnitude of VDD and the total resistance of resistor R1 and the transistors MP1, MP2 to MPm.

When $I_{LN}$ is not greater than $I_{PU}$, the voltage of I/O terminal PAD remains at VDD, the logic state of node CSI remains at logic "1". The control circuit 350 is coupled to node CSI and, in response to no change of the logic state of node CSI, detects no damage on the N-side. The control circuit 350 then outputs a signal indicating that the IC device passes the N-side checking BIST operation at this particular I/O terminal PAD.

When Iux is greater than $I_{PU}$, the voltage of I/O terminal PAD is decreased toward VSS. When the voltage of I/O terminal PAD is decreased to a predetermined voltage level, the logic state of node CSI is changed, e.g., to logic "0". The control circuit 350 is coupled to node CSI and, in response to a change of the logic state of node CSI, detects that a leakage current exists and that there is damage on the N-side, e.g., among NMOS transistors. The control circuit 350 then outputs a signal indicative of the detected N-side damage.

In the described BIST operation, $I_{PU}$ is configured as a reference current to be compared with $I_{LN}$ to detect N-side damage. A current value of $I_{PU}$ corresponds to BIST sensitivity of the BIST circuit 300A. For example, a higher current value of $I_{PU}$ corresponds to lower BIST sensitivity (i.e., only sufficiently high leakage current is detectable), and a lower current value of $I_{PU}$ corresponds to higher BIST sensitivity (i.e., even small leakage current is detectable). At a predetermined voltage value (or magnitude) of VDD, the current value of $I_{PU}$ is configured by resistance of resistor R1 and/or a number of the transistors MP1, MP2 to MPm.

As described herein, damage to an IC device typically manifests as either a hard failure or a soft failure. In some situations, ESD damage that manifests as hard failures is associated with leakage currents on the order of milliamperes (mA), which is sufficient to render MOSFETs, such as NMOS transistors and PMOS transistors, no longer functional. In further situations, ESD damage that manifests as soft failures is associated with leakage currents on the order of nanoamperes (nA) to microamperes (μA), which is not sufficient to immediately render MOSFETs no longer functional, and which is six orders of magnitude (six powers of ten) to three orders of magnitude (three powers of ten) smaller than the leakage currents associated with ESD-induced hard failures. However, it is possible that ESD-induced soft failures worsen over time, eventually leading to latent defective performance of the IC device, which reduces long term reliability of the IC device.

In at least one embodiment, the pull-up circuit 310 is configured to, for a predetermined VDD, e.g., 1 V, have a current value of $I_{PU}$ at 1 μA or below. As a result, it is possible in one or more embodiments to detect soft failures, such as ESD-induced soft failures, with leakage currents below 1 μA. This is an improvement over other approaches which are configured to detect hard failures with leakage currents on the order of milliamperes (mA), but not soft failures with leakage currents on the order of nanoamperes (nA) to microamperes (μA). A current value of $I_{PU}$ at 1 μA or below is sometimes referred to as a weak pull. In some embodiments, a current value of $I_{PU}$ at 1 μA or below is achieved by configuring resistor R1 as including a sufficient number of resistive regions (or resistor cells) and/or by configuring the transistor string 312 as including a sufficient number of transistors, so as to obtain a desired total resistance of the pull-up circuit 310 (when switch SW1 is closed), i.e., a desired total resistance of resistor R1 and the transistors MP1, MP2 to MPm in the transistor string 312. In some embodiments, the desired total resistance of the pull-up circuit 310 is roughly approached by adjusting or selecting the number of resistive regions in resistor R1, and then is finely approached by adjusting or selecting the number of transistors in the transistor string 312. Specifically, non-limiting examples of the total resistance are described with respect to FIG. 3G.

The described voltage value of 1 V for VDD is an example. Other voltage values of VDD are within the scopes of various embodiments. In some embodiments, the voltage value of VDD for a BIST operation is different from a voltage value of VDD in a normal or non-BIST operation of the IC device. In at least one embodiment, the voltage value of VDD in a BIST operation is increased, compared to a voltage value of VDD in a normal operation. A reason for an increased voltage value of VDD in a BIST operation is to enlarge leakage currents caused by ESD-induced soft failures, for facilitating detection of such leakage currents and the corresponding ESD-induced soft failures. In a non-limiting example, a voltage value of VDD is about 0.75 V+/−10% for a normal operation, about 0.65 V or about 0.55 V+/−10% for a low speed/low power mode, about 0.85 V~1.25 V+/−10% for a boost mode, and 1 V for a BIST operation.

As described herein, the pull-up circuit 310 comprises at least one transistor. In various embodiments including the example configuration in FIG. 3A, the pull-up circuit 310 comprises multiple transistors coupled into a transistor string, such as the transistor string 312. In at least one embodiment, by including in the pull-up circuit 310 a transistor string of multiple transistors, it is possible to reduce adverse effects of PVT variations on characteristics of the transistor(s) in the pull-up circuit 310. As a result, it is possible in one or more embodiments with multiple transistors in the pull-up circuit 310 to ensure that BIST operations using such multiple transistors are reliable and substantially invariant with respect to process, voltage and temperature. Specifically, non-limiting examples of the described advantage are described with respect to FIG. 3G.

As described herein, the gate(s) of the transistor(s) of the pull-up circuit 310 is/are biased by a bias voltage Vbias1 to configure the transistor(s) of the pull-up circuit 310 to be operable at a DC operating point. As a result, it is possible in one or more embodiments to set $I_{PU}$ to a constant and steady state current value, and/or to set the transistor(s) to be operable in a region where the transistor(s) exhibit(s) a linear characteristics, and/or to achieve a balance between power consumption and overall performance.

As described herein, resistor R1 is coupled to the source of the transistor MP1 at a first end of the transistor string 312 that is closest to VDD. In other words, resistor R1 is coupled to the transistors of the transistor string 312 to configure a source degeneration arrangement. Resistor R1 in such a source degeneration arrangement is sometimes referred to as a source resistor. By configuring the pull-up circuit 310 with a source degeneration arrangement as described, it is possible in one or more embodiments to further enhance linearity of the transistors' characteristics, because parts of voltage fluctuations occur over resistor R1, rather than across gate-source overdrives of the transistors, resulting in smoothened variations of $I_{PU}$.

In a BIST circuit in accordance with some embodiments, it is possible to achieve one or more advantages including, but not limited to, high resistance efficiency, capability to detect sub-μA leakage current, embeddability in advanced packages, standard cell compliance, or the like. In at least one embodiment, high resistance efficiency is enhanced more than one hundred times compared to other approaches at a same technology node (e.g., 3 nm process). In at least one embodiment, the capability to detect sub-μA leakage currents and corresponding ESD-induced soft failures is an improvement over other approaches which are not configured, or unable, to detect ESD-induced soft failures with such small leakage currents. In at least one embodiment, a BIST circuit in accordance with some embodiments is compact and embeddable in advanced packages for which a specific, non-limiting example is described with respect to FIG. 10B.

Figure 3B:
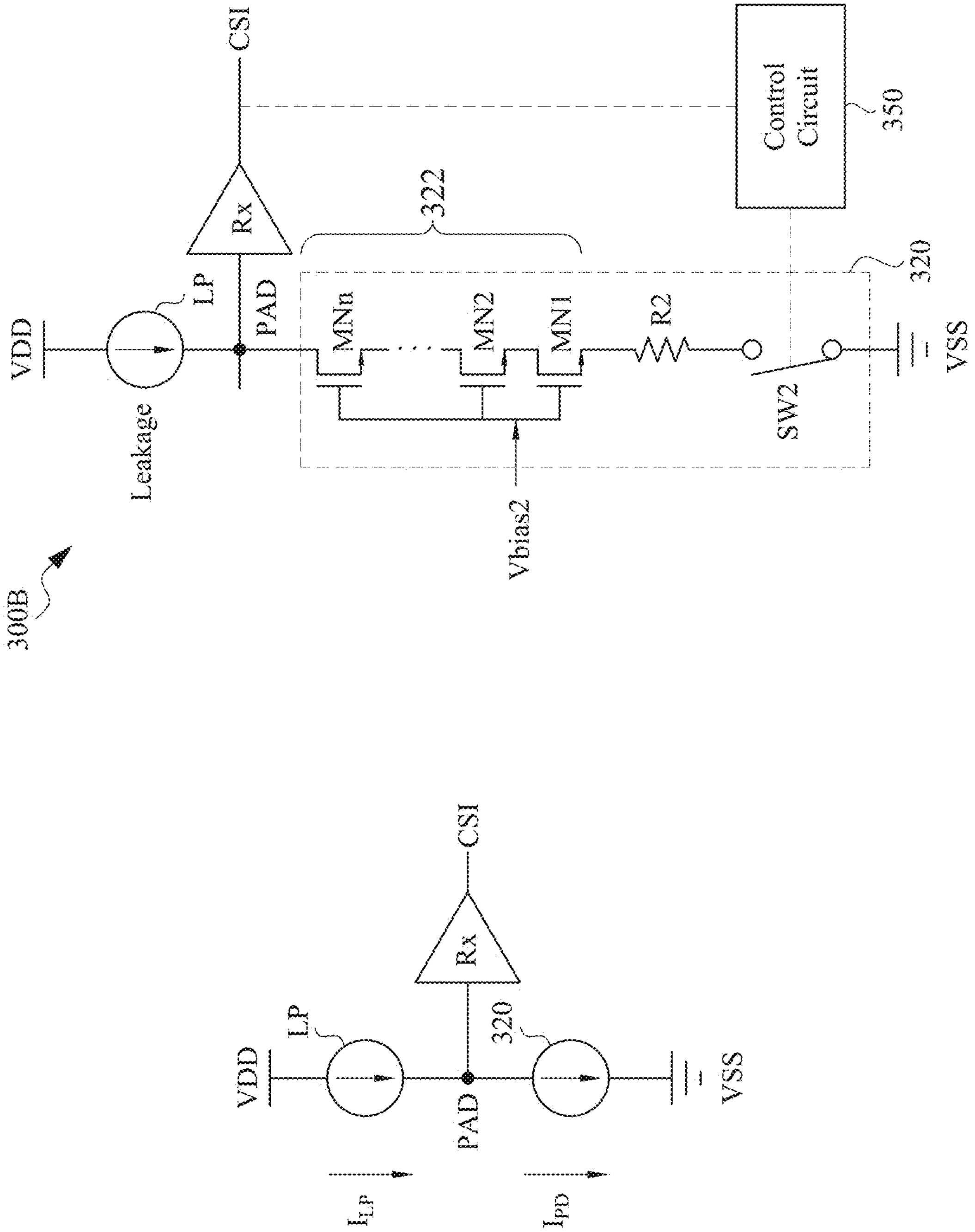

FIG. 3B is a schematic circuit diagram of a BIST circuit 300B, in accordance with some embodiments. In some embodiments, the BIST circuit 300B corresponds to one or more BIST circuits described with respect to FIGS. 1, 2.

The BIST circuit 300B comprises a pull-down circuit 320, and a control circuit 350. In some embodiments, the pull-down circuit 320 corresponds to the pull-down circuit 220.

The pull-down circuit 320 comprises a switch SW2, a resistor R2, and a plurality of transistors MN1, MN2 to MNn, where n is a natural number. In some embodiments, m=n. In at least one embodiment, m is different from n. The switch SW2, resistor R2 and transistors MN1, MN2 to MNn are coupled in series between VSS and I/O terminal PAD of an I/O circuit as described herein. For simplicity, input buffer Rx and node CSI of the I/O circuit are illustrated in FIG. 3B, whereas other components or circuits of the I/O circuit are omitted. In at least one embodiment, the pull-down circuit 320 comprises a transistor (e.g., n=1) instead of a plurality of transistors.

The switch SW2 is coupled to the control circuit 350 which is configured to control the switch SW2 to be selectively closed in a BIST operation, and to be opened in other operations of an IC device comprising the BIST circuit 300B. In at least one embodiment, the switch SW2 comprises a transistor. Other switch configurations are within the scopes of various embodiments.

The transistors MN1, MN2 to MNn are N-type transistors, e.g., NMOS transistors. Other transistor configurations are within the scopes of various embodiments. The transistors MN1, MN2 to MNn are coupled in series into a transistor string 322 in which a drain of a transistor is coupled to a source of a subsequent transistor. For example, a drain of the transistor MN1 is coupled to a source of the subsequent transistor MN2. A source of the transistor MN1 at a first end of the transistor string 322 is coupled to an end of resistor R2. Another end of resistor R2 is coupled by the switch SW2 to VSS. A drain of the transistor MNn at a second end of the transistor string 322 is coupled to I/O terminal PAD. Gates of the transistors MN1, MN2 to MNn are coupled together and configured to receive a bias voltage Vbias2. In some embodiments, the bias voltage Vbias2 is predetermined to configure the transistors MN1, MN2 to MNn to be operable at a direct current (DC) operating point. In at least one embodiment, Vbias1 is different from Vbias2. In at least one embodiment, Vbias2 is generated by a bias voltage generation circuit, such as a voltage divider, similar to the bias voltage generation circuit 302.

In at least one embodiment, resistor R2 comprises one or more resistive regions each corresponding to a resistor cell, as described with respect to resistor R1. In some embodiments, a resistance value of resistor R2 is different from a resistance value of resistor R1. In at least one embodiment, resistor R1 and resistor R2 have the same resistance value.

The control circuit 350 is configured to control the pull-down circuit 320 to perform a BIST operation to check for P-side damage of the IC device and/or I/O circuit including the BIST circuit 300B. Such a BIST operation is sometimes referred to as an P-side checking BIST operation. In some embodiments, P-side damage includes any damage that gives rise to a leakage current between I/O terminal PAD and VDD. P-side damage potentially occurs at one or more N-type transistors or circuit elements, such as NMOS transistors included in the input buffer Rx and output buffer Tx (not shown in FIG. 3B) coupled to I/O terminal PAD.

In the P-side checking BIST operation, in accordance with some embodiments, the control circuit 350 is configured to close switch SW2, and while switch SW2 is being closed, detect a leakage current between I/O terminal PAD and VDD. In FIG. 3B, such a leakage current is schematically represented as current $I_{LP}$ of a current source LP. When no or insubstantial leakage current exists, $I_{LP}$ is zero or substantially zero. As switch SW2 is closed, I/O terminal PAD is coupled to VSS by the serial connection of resistor R2 and the transistors MN1, MN2 to MNn, a voltage of I/O terminal PAD is pulled-down to VSS, and node CSI has a corresponding logic state, e.g., logic "0". The pull-down circuit 320 with switch SW2 closed is schematically represented as a current source having a current $I_{PD}$. $I_{PD}$ corresponds to the total resistance of resistor R2 and the transistors MN1, MN2 to MNn. In some embodiments, $I_{PU}$ is different from $I_{PD}$.

When $I_{LP}$ is not greater than $I_{PD}$, the voltage of I/O terminal PAD remains at VSS, the logic state of node CSI remains at logic "0". The control circuit 350 is coupled to node CSI and, in response to no change of the logic state of node CSI, detects no damage on the P-side. The control circuit 350 then outputs a signal indicating that the IC device passes the P-side checking BIST operation at this particular I/O terminal PAD.

When $I_{LP}$ is greater than $I_{PD}$, the voltage of I/O terminal PAD is increased toward VDD. When the voltage of I/O terminal PAD is increased to a predetermined voltage level, the logic state of node CSI is changed, e.g., to logic "1". The control circuit 350 is coupled to node CSI and, in response to a change of the logic state of node CSI, detects that a leakage current exists and that there is damage on the P-side, e.g., among PMOS transistors. The control circuit 350 then outputs a signal indicative of the detected P-side damage.

In the described BIST operation, $I_{PD}$ is configured as a reference current to be compared with $I_{LP}$ to detect P-side damage. A current value of $I_{PD}$ corresponds to BIST sensitivity of the BIST circuit 300B. For example, a higher current value of $I_{PD}$ corresponds to lower BIST sensitivity (i.e., only sufficiently high leakage current is detectable), and a lower current value of $I_{PD}$ corresponds to higher BIST sensitivity (i.e., even small leakage current is detectable). The current value of $I_{PD}$ is configured by resistance of resistor R2 and/or a number of the transistors MN1, MN2 to MNn, in manners similar to those described with respect to the current value of $I_{PU}$. One or more advantages described herein are achievable by the IC device 300B, in accordance with some embodiments.

Figure 3C:
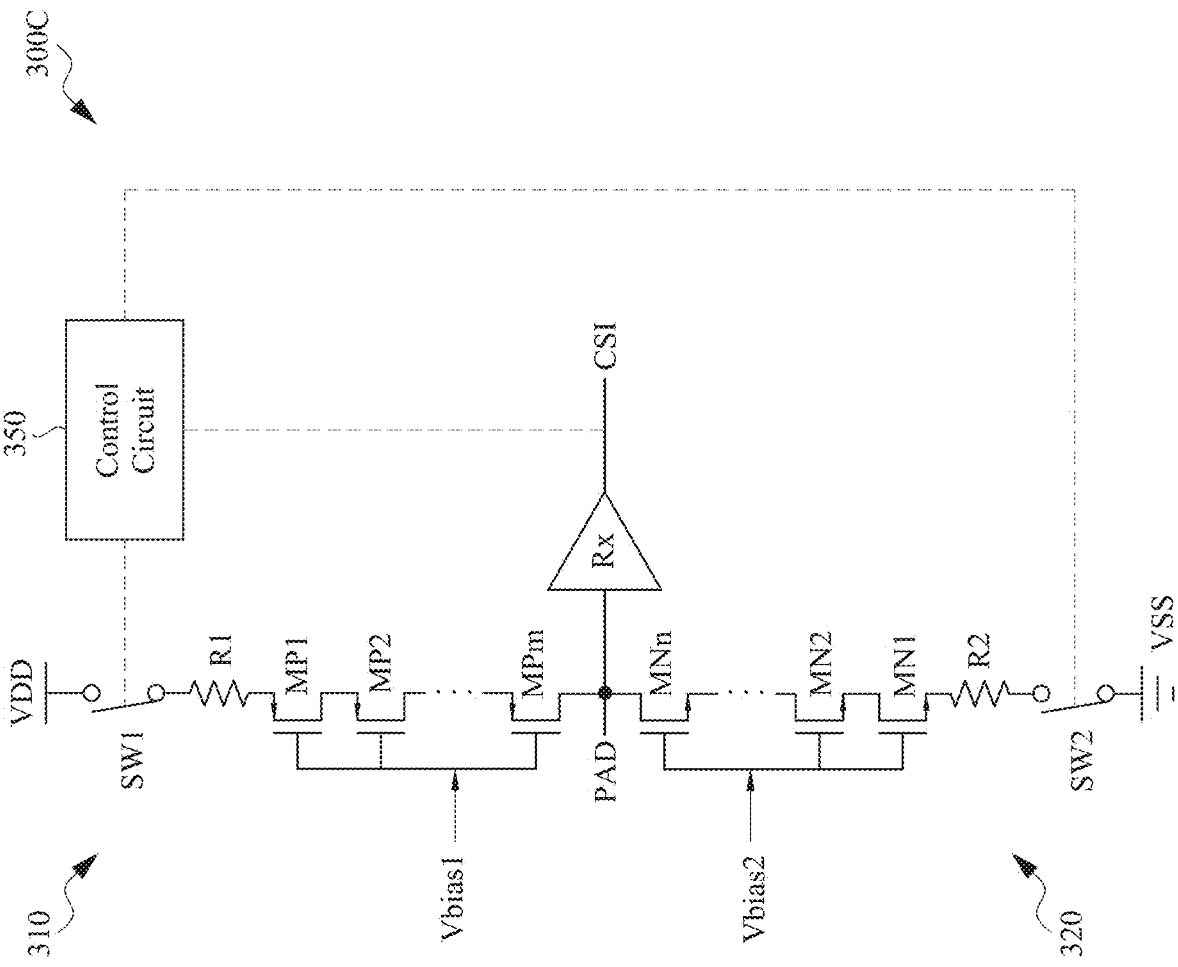

FIG. 3C is a schematic circuit diagram of a BIST circuit 300C, in accordance with some embodiments. In some embodiments, the BIST circuit 300C corresponds to one or more BIST circuits described with respect to FIGS. 1, 2.

The BIST circuit 300C comprises a pull-up circuit 310, a pull-down circuit 320 and a control circuit 350, as described with respect to FIGS. 3A-3B. The pull-up circuit 310 and pull-down circuit 320 are coupled to the same I/O terminal PAD of an I/O circuit. For simplicity, input buffer Rx and node CSI of the I/O circuit are illustrated in FIG. 3C, whereas other components or circuits of the I/O circuit are omitted.

In a first BIST operation, e.g., an N-side checking BIST operation, the control circuit 350 is configured to control switch SW2 to be opened, thereby disabling the pull-down circuit 320. The control circuit 350 is configured to control switch SW1 to be closed and detect a leakage current on the N-side, as described with respect to FIG. 3A.

In a second BIST operation, e.g., a P-side checking BIST operation, the control circuit 350 is configured to control switch SW1 to be opened, thereby disabling the pull-up circuit 310. The control circuit 350 is configured to control switch SW2 to be closed and detect a leakage current on the P-side, as described with respect to FIG. 3B. One or more advantages described herein are achievable by the IC device 300C, in accordance with some embodiments.

Figure 3D:
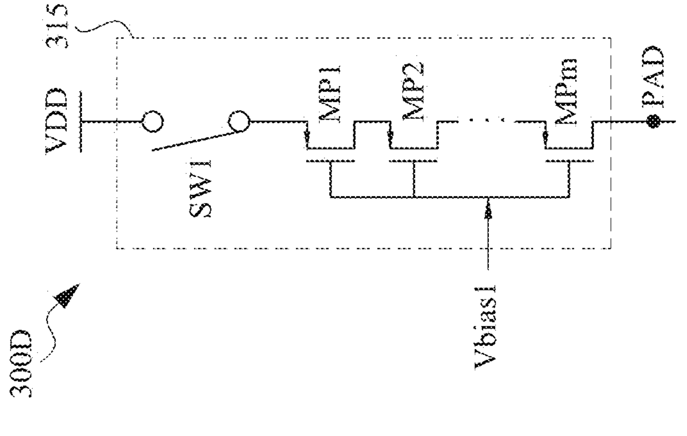
Figure 3E:
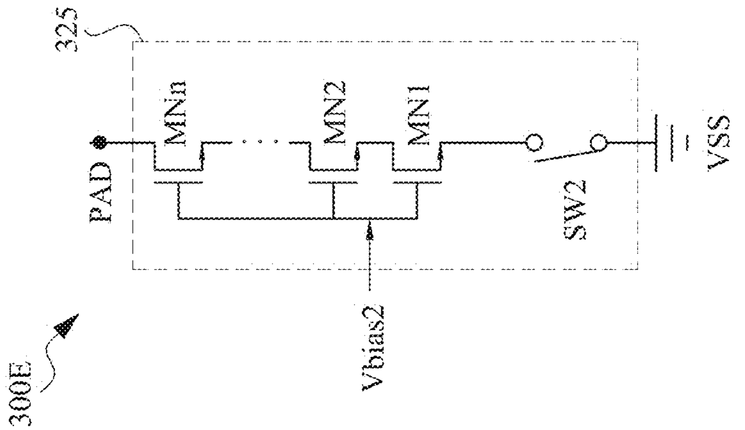
Figure 3F:
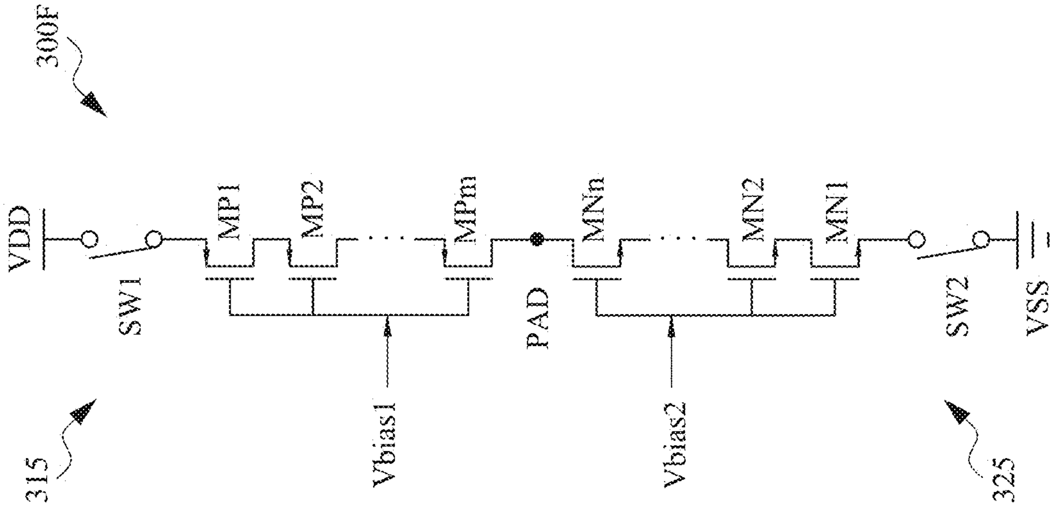

FIGS. 3D-3F are schematic circuit diagrams of corresponding BIST circuits 300D-300F, in accordance with some embodiments. In some embodiments, each of the BIST circuits 300D-300F corresponds to one or more BIST circuits described with respect to FIGS. 1, 2.

In FIG. 3D, the BIST circuit 300D comprises a pull-up circuit 315, and a control circuit (not shown) corresponding to the control circuit 350. The pull-up circuit 315 is similar to the pull-up circuit 310 of the BIST circuit 300A, except that resistor R1 is omitted from the pull-up circuit 315. The control circuit of the BIST circuit 300D is configured to control the pull-up circuit 315 to perform an N-side checking BIST operation in a manner similar to the BIST circuit 300A. In at least one embodiment, by configuring the pull-up circuit 315 with a sufficient number of transistors MP1, MP2 to MPm and/or with an appropriate voltage level of Vbias1, it is possible to for the BIST circuit 300D to provide a sub-μm reference current, or weak pull, for detecting soft failures such as ESD-induced soft failures. One or more advantages described herein are achievable by the IC device 300D, in accordance with some embodiments.

In FIG. 3E, the BIST circuit 300E comprises a pull-down circuit 325, and a control circuit (not shown) corresponding to the control circuit 350. The pull-down circuit 325 is similar to the pull-down circuit 320 of the BIST circuit 300B, except that resistor R2 is omitted from the pull-down circuit 325. The control circuit of the BIST circuit 300E is configured to control the pull-down circuit 325 to perform a P-side checking BIST operation in a manner similar to the BIST circuit 300B. In at least one embodiment, by configuring the pull-down circuit 325 with a sufficient number of transistors MN1, MN2 to MNn and/or with an appropriate voltage level of Vbias2, it is possible to for the BIST circuit 300E to provide a sub-μm reference current, or weak pull, for detecting soft failures such as ESD-induced soft failures. One or more advantages described herein are achievable by the IC device 300E, in accordance with some embodiments.

In FIG. 3F, the BIST circuit 300F comprises a pull-up circuit 315, a pull-down circuit 325 and a control circuit (not shown) corresponding to the control circuit 350, as described with respect to FIGS. 3D-3E. The pull-up circuit 315 and pull-down circuit 325 are coupled to the same I/O terminal PAD of an I/O circuit.

In a first BIST operation, e.g., an N-side checking BIST operation, the control circuit of the BIST circuit 300F is configured to control switch SW2 to be opened, thereby disabling the pull-down circuit 325. The control circuit is configured to control switch SW1 to be closed and detect a leakage current on the N-side, as described with respect to FIGS. 3A, 3D.

In a second BIST operation, e.g., a P-side checking BIST operation, the control circuit of the BIST circuit 300F is configured to control switch SW1 to be opened, thereby disabling the pull-up circuit 315. The control circuit is configured to control switch SW2 to be closed and detect a leakage current on the P-side, as described with respect to FIGS. 3B, 3E. One or more advantages described herein are achievable by one or more of the IC devices 300D, 300E, 300F, in accordance with some embodiments.

Figure 3G:
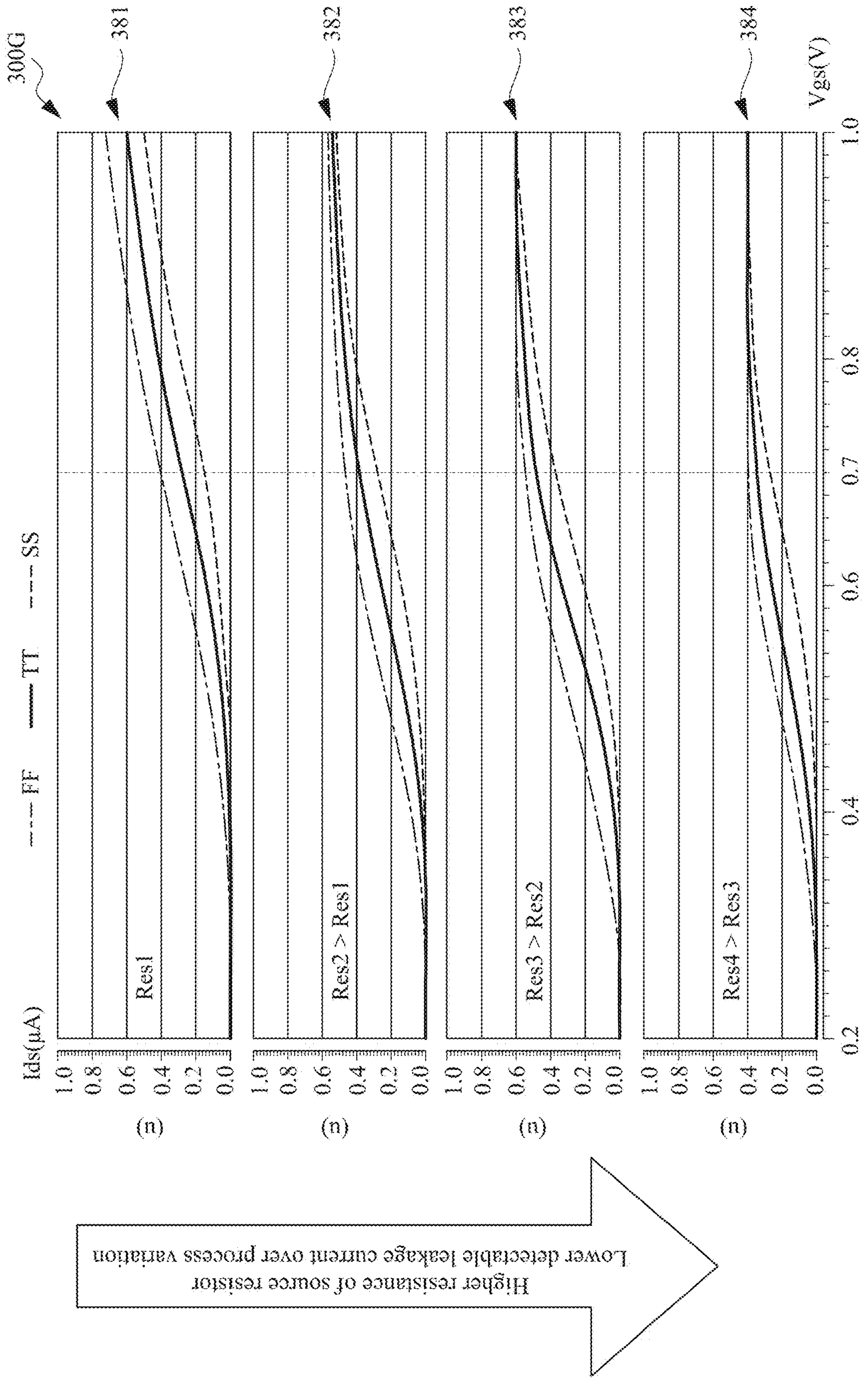
FIG. 3G is graph showing current-voltage characteristics of transistors in one or more pull-up circuits and/or pull-down circuits at various process-voltage-temperature (PVT) variations, in accordance with some embodiments.

FIG. 3G is graph 300G showing non-limiting, example current-voltage characteristics of transistors in one or more pull-up circuits and/or pull-down circuits with process-voltage-temperature (PVT) variations, in accordance with some embodiments. In some embodiments, the pull-up circuits and/or pull-down circuits correspond to one or more of the pull-up circuits and/or pull-down circuits described with respect to FIGS. 2, 3A-3F.

A group 381 includes current-voltage characteristics of transistors at various corners FF (NMOS fast-PMOS fast), TT (NMOS typical-PMOS typical) and SS (NMOS slow-PMOS slow), for a first resistance value Res1 of a source resistor, such as resistor R1 or resistor R2. In a non-limiting example, Res1=0 kΩ. As can be seen at a gate-source voltage Vgs of about 0.7 V, due to PVT variations, a drain-source currents Ids at corners FF, TT, SS vary between about 2 μA and about 4 μA. In some embodiments, Vgs corresponds to Vbias1 and/or Ids corresponds to $I_{PU}$ or $I_{PD}$. In some situations, the large variation of Ids (about 2 μA between 2 μA~4 μA) and/or the high current value (about 2

μA~4 μA) of Ids make it difficult to achieve reliable detection of leakage currents and/or detection of ESD-induced soft failures.

A group 382 includes current-voltage characteristics of transistors at corners FF, TT and SS, and for a second resistance value Res2 of the source resistor, where Res2>Res 1. In a non-limiting example, Res2=150 kΩ. At Vgs of about 0.7 V, Ids at corners FF, TT, SS vary between about 0.5 μA and about 1 μA. Thus, the variation of Ids is reduced to about 0.5 μA and the current value of Ids is reduced to 1 μA and lower. As a result, it is possible in one or more embodiments to achieve reliable detection of sub-μm leakage currents and/or ESD-induced soft failures.

A group 383 includes current-voltage characteristics of transistors at corners FF, TT and SS, and for a third resistance value Res3 of the source resistor, where Res3>Res 2. In a non-limiting example, Res3=300 kΩ. At Vgs of about 0.7 V, Ids at corners FF, TT, SS vary between about 0.4 HA and about 0.6 μA. Thus, the variation of Ids is further reduced to about 0.2 HA and the current value of Ids is further reduced well below 1 μA. As a result, it is possible in one or more embodiments to achieve enhanced reliable detection of sub-μm leakage currents and/or ESD-induced soft failures.

A group 384 includes current-voltage characteristics of transistors at corners FF, TT and SS, and for a fourth resistance value Res4 of the source resistor, where Res4>Res 3. In a non-limiting example, Res4=450 kΩ. At Vgs of about 0.7 V, Ids at corners FF, TT, SS vary between about 0.3 HA and about 0.4 μA. Thus, the variation of Ids is even further reduced to about 0.1 μA and the current value of Ids is even further reduced to 0.4 HA and below. As a result, it is possible in one or more embodiments to achieve further enhanced reliable detection of sub-μm leakage currents and/or ESD-induced soft failures.

Figure 4B:
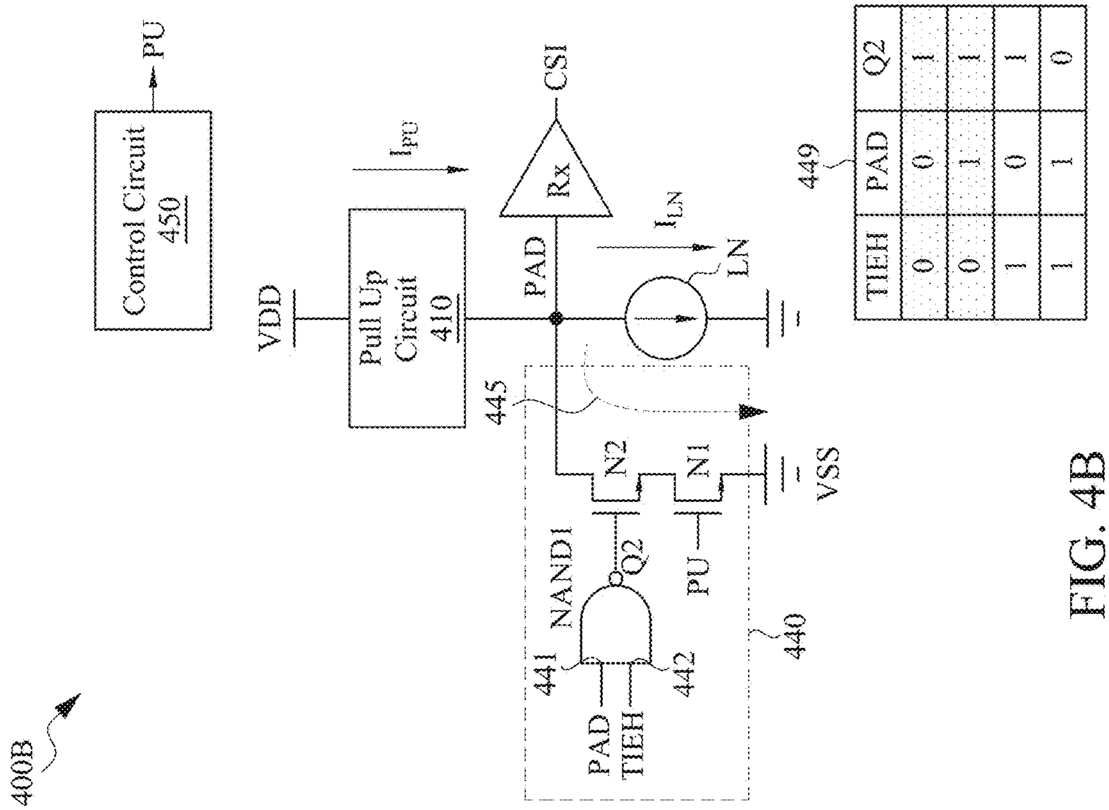
FIGS. 4A-4C are schematic circuit diagrams of various BIST circuits having detection assist circuits, in accordance with some embodiments.
Figure 4A:
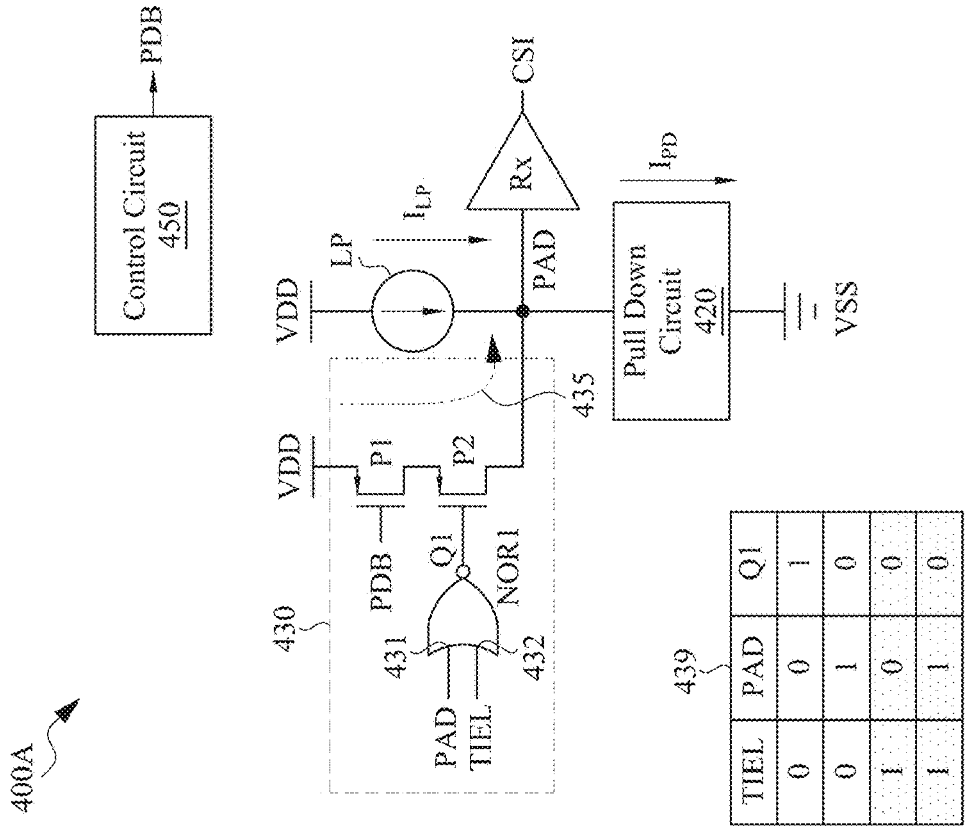

FIG. 4A is a schematic circuit diagram of a BIST circuit 400A, in accordance with some embodiments. In some embodiments, the BIST circuit 400A corresponds to one or more BIST circuits described with respect to FIGS. 1-2, 3A-3F.

The BIST circuit 400A comprises a pull-down circuit 420, a pull-down detection assist circuit 430, and a control circuit 450. In some embodiments, the pull-down circuit 420 corresponds to the pull-down circuit 220, and/or the pull-down detection assist circuit 430 corresponds to the pull-down detection assist circuit 230, and/or the control circuit 450 corresponds to the control circuit 250 and/or the control circuit 350.

The pull-down circuit 420 is coupled between VSS and an I/O terminal PAD of an I/O circuit as described herein. For simplicity, input buffer Rx and node CSI of the I/O circuit are illustrated in FIG. 4A, whereas other components or circuits of the I/O circuit are omitted. In some embodiments, the pull-down circuit 420 corresponds to one or more pull-down circuits described with respect to one or more of FIGS. 3A-3F. In at least one embodiment, any pull-down circuit configured to pull a voltage of I/O terminal PAD to VSS under control of the control circuit 450 is usable as the pull-down circuit 420.

The pull-down detection assist circuit 430 comprises P-type transistors P1, P2, and a logic circuit NOR1. The transistors P1, P2 are coupled in series between VDD and I/O terminal PAD. Specifically, a source of the transistor P1 is coupled to VDD, a drain of the transistor P1 is coupled to a source of the transistor P2, a drain of the transistor P2 is coupled to I/O terminal PAD. A gate of the transistor P1 is coupled to the control circuit 450 to receive a control signal PDB. A gate of the transistor P2 is coupled to an output Q1 of logic circuit NOR1. In the example configuration in FIG. 4A, logic circuit NOR1 is a NOR gate having a truth table 439. Logic circuit NOR1 further comprises two inputs 431, 432. The input 431 is coupled to I/O terminal PAD to receive the voltage of I/O terminal PAD. For simplicity, a node, pad or pin and the voltage or signal thereon are designated by the same reference numeral or label. For example, the input 431 receives a signal or voltage PAD of I/O terminal PAD. The input 432 is configured to receive a control signal TIEL. In at least one embodiment, signal TIEL is a control signal supplied by a circuit other than the control circuit 450, e.g., a circuit of an IC device comprising the BIST circuit 400A and outside the BIST circuit 400A. In some embodiments, signal TIEL is a low voltage signal (tie low) corresponding to logic "0". For example, the input 432 is coupled to VSS. Other configurations are within the scopes of various embodiments.

The control circuit 450 is configured to supply signal PDB to the gate of the transistor P1 to enable the pull-down detection assist circuit 430. Although not illustrated in FIG. 4A for simplicity, the control circuit 450 is coupled to node CSI, and also to the pull-down circuit 420 to supply a control signal (not shown) to enable or disable the pull-down circuit 420, e.g., by closing or opening a switch in the pull-down circuit 420 in a manner similar to switch SW2. In some embodiments, the control signal for enabling or disabling the pull-down circuit 420 corresponds to signal PDB for enabling or disabling the pull-down detection assist circuit 430. As a result, in such an arrangement in accordance with some embodiments, the pull-down circuit 420 and the pull-down detection assist circuit 430 are enabled and/or disabled in a related or synchronized manner. In at least one embodiment, the control signal for enabling or disabling the pull-down circuit 420 is separated or independent from signal PDB for enabling or disabling the pull-down detection assist circuit 430. As a result, in such an arrangement in accordance with some embodiments, the pull-down circuit 420 and the pull-down detection assist circuit 430 are enabled and/or disabled in a separated manner, i.e., independently from each other. In at least one embodiment, in a BIST operation, the control circuit 450 is configured to enable the pull-down circuit 420 without enabling the pull-down detection assist circuit 430. In such an arrangement in accordance with some embodiments, a P-side checking BIST operation is performed by using the pull-down circuit 420 in a manner similar to FIG. 3B.

In a P-side checking BIST operation in accordance with some embodiments, both of the pull-down circuit 420 and pull-down detection assist circuit 430 are enabled. When enabled, the pull-down circuit 420 pulls I/O terminal PAD towards VSS and, as a result, node CSI has a corresponding logic state, e.g., logic "0". VSS on I/O terminal PAD is also supplied to the input 431 of logic circuit NOR1, resulting in logic "0" at the input 431. As can be seen from the truth table 439, with signal TIEL having logic "0", the input 431 controls output Q1, i.e., logic "0" at the input 431 results in logic "1" at output Q1 which, in turn, turns OFF the transistor P2. As a result, VDD is isolated by the turned OFF transistor P2 from I/O terminal PAD having VSS or logic "0" thereon. The pull-down circuit 420 being enabled is schematically represented by a current $I_{PD}$. A leakage current on the P-side is schematically represented as current $I_{LP}$ of a current source LP. A relationship between $I_{PD}$ and $I_{LP}$ corresponds to whether detectable P-side damage exists, as described with respect to FIG. 3B.

The pull-down detection assist circuit 430 is enabled by signal PDB turning ON transistor P1. For example, signal PDB having logic "0" turns ON transistor P1. When detectable P-side damage does not exist, i.e., when $I_{LP}$ is not greater than $I_{PD}$, the voltage of I/O terminal PAD remains at VSS, and the logic state of node CSI remains at logic "0".

When detectable P-side damage exists, i.e., when $I_{LP}$ is greater than $I_{PD}$, a leakage current flows between VDD and I/O terminal PAD, i.e., from VDD to I/O terminal PAD. As a result, the voltage of I/O terminal PAD and the input 431 of logic circuit NOR1 coupled to I/O terminal PAD is increased from VSS. As can be seen from the truth table 439, with signal TIEL having logic "0", the voltage PAD at the input 431 controls output Q1. When the voltage PAD at the input 431 is increased to a predetermined threshold, a logic state of the input 431 is changed from logic "0" to logic "1", causing the logic state of output Q1 to be changed from logic "1" to logic "0". The changed logic "0" of output Q1 turns ON transistor P2. With transistor P1 already turned ON by signal PDB, a current path 435 is formed, by turned ON transistors P1, P2, through the pull-down detection assist circuit 430 to couple VDD to I/O terminal PAD. As a result, the voltage of I/O terminal PAD is quickly pulled to VDD, causing a corresponding quick or early change of the logic state of node CSI from logic "0" to logic "1". As described with respect to FIG. 3B, such a change of the logic state of node CSI is determined by the control circuit 450 as corresponding to detection of P-side damage.

In at least one embodiment, by monitoring the voltage at I/O terminal PAD (e.g., by coupling I/O terminal PAD to the input 431 of logic circuit NOR1) it is possible for the pull-down detection assist circuit 430 to detect a leakage current flowing between I/O terminal PAD and a power supply terminal (e.g., VDD). In response to detecting such leakage current, the current path 435 is formed through the pull-down detection assist circuit 430 to couple I/O terminal PAD to the power supply terminal (e.g., VDD). As a result, it is possible in one or more embodiments to quickly and surely change a voltage level (or a logic state) of I/O terminal PAD and the corresponding logic state of node CSI, which, in turn, improves at least one of speed, reliability, or sensitivity of the BIST circuit 400A, in accordance with some embodiments.

FIG. 4B is a schematic circuit diagram of a BIST circuit 400B, in accordance with some embodiments. In some embodiments, the BIST circuit 400B corresponds to one or more BIST circuits described with respect to FIGS. 1-2, 3A-3F.

The BIST circuit 400B comprises a pull-up circuit 410, a pull-up detection assist circuit 440, and a control circuit 450. In some embodiments, the pull-up circuit 410 corresponds to the pull-up circuit 210, and/or the pull-up detection assist circuit 440 corresponds to the pull-up detection assist circuit 240, and/or the control circuit 450 corresponds to the control circuit 250 and/or the control circuit 350.

The pull-up circuit 410 is coupled between VDD and an I/O terminal PAD of an I/O circuit as described herein. For simplicity, input buffer Rx and node CSI of the I/O circuit are illustrated in FIG. 4B, whereas other components or circuits of the I/O circuit are omitted. In some embodiments, the pull-up circuit 410 corresponds to one or more pull-up circuits described with respect to one or more of FIGS. 3A-3F. In at least one embodiment, any pull-up circuit configured to pull a voltage of I/O terminal PAD to VDD under control of the control circuit 450 is usable as the pull-up circuit 410.

The pull-up detection assist circuit 440 comprises N-type transistors N1, N2, and a logic circuit NAND1. The transistors N1, N2 are coupled in series between VSS and I/O terminal PAD. Specifically, a source of the transistor N1 is coupled to VSS, a drain of the transistor N1 is coupled to a source of the transistor N2, a drain of the transistor N2 is coupled to I/O terminal PAD. A gate of the transistor N1 is coupled to the control circuit 450 to receive a control signal PU. A gate of the transistor N2 is coupled to an output Q2 of logic circuit NAND1. In the example configuration in FIG. 4B, logic circuit NAND1 is a NAND gate having a truth table 449. Logic circuit NAND1 further comprises two inputs 441, 442. The input 441 is coupled to I/O terminal PAD to receive the voltage of I/O terminal PAD. The input 442 is configured to receive a control signal TIEH. In at least one embodiment, signal TIEH is a control signal supplied by a circuit other than the control circuit 450, e.g., a circuit of an IC device comprising the BIST circuit 400B and outside the BIST circuit 400B. In some embodiments, signal TIEH is a high voltage signal (tie high) corresponding to logic "1". For example, the input 442 is coupled to VDD. Other configurations are within the scopes of various embodiments.

The control circuit 450 is configured to supply signal PU to the gate of the transistor N1 to enable the pull-up detection assist circuit 440. Although not illustrated in FIG. 4B for simplicity, the control circuit 450 is coupled to node CSI, and also to the pull-up circuit 410 to supply a control signal (not shown) to enable or disable the pull-up circuit 410, e.g., by closing or opening a switch in the pull-up circuit 410 in a manner similar to switch SW2. In some embodiments, the control signal for enabling or disabling the pull-up circuit 410 corresponds to signal PU for enabling or disabling the pull-up detection assist circuit 440. As a result, in such an arrangement in accordance with some embodiments, the pull-up circuit 410 and the pull-up detection assist circuit 440 are enabled and/or disabled in a related or synchronized manner. In at least one embodiment, the control signal for enabling or disabling the pull-up circuit 410 is separated or independent from signal PU for enabling or disabling the pull-up detection assist circuit 440. As a result, in such an arrangement in accordance with some embodiments, the pull-up circuit 410 and the pull-up detection assist circuit 440 are enabled and/or disabled in a separated manner, i.e., independently from each other. In at least one embodiment, in a BIST operation, the control circuit 450 is configured to enable the pull-up circuit 410 without enabling the pull-up detection assist circuit 440. In such an arrangement in accordance with some embodiments, an N-side checking BIST operation is performed by using the pull-up circuit 410 in a manner similar to FIG. 3A.

In an N-side checking BIST operation in accordance with some embodiments, both of the pull-up circuit 410 and pull-up detection assist circuit 440 are enabled. When enabled, the pull-up circuit 410 pulls I/O terminal PAD towards VDD and, as a result, node CSI has a corresponding logic state, e.g., logic "1". VDD on I/O terminal PAD is also supplied to the input 441 of logic circuit NAND1, resulting in logic "1" at the input 441. As can be seen from the truth table 449, with signal TIEH having logic "1", the input 441 controls output Q2, i.e., logic "1" at the input 441 results in logic "O" at output Q2 which, in turn, turns OFF the transistor N2. As a result, VSS is isolated by the turned OFF transistor N2 from I/O terminal PAD having VDD or logic "1" thereon. The pull-up circuit 410 being enabled is schematically represented by a current $I_{PU}$. A leakage current on the N-side is schematically represented as current $I_{LN}$ of a current source LN. A relationship between $I_{PU}$ and $I_{LN}$ corresponds to whether detectable N-side damage exists, as described with respect to FIG. 3A.

The pull-up detection assist circuit 440 is enabled by signal PU turning ON transistor N1. For example, signal PU having logic "1" turns ON transistor N1. When detectable N-side damage does not exist, i.e., when $I_{LN}$ is not greater than $I_{PU}$, the voltage of I/O terminal PAD remains at VDD, and the logic state of node CSI remains at logic "1".

When detectable N-side damage exists, i.e., when $I_{LN}$ is greater than $I_{PU}$, a leakage current flows between VSS and I/O terminal PAD, i.e., from I/O terminal PAD to VSS. As a result, the voltage of I/O terminal PAD and the input 441 of logic circuit NAND1 coupled to I/O terminal PAD is decreased from VDD. As can be seen from the truth table 449, with signal TIEH having logic "1", the voltage PAD at the input 441 controls output Q2. When the voltage PAD at the input 441 is decreased to a predetermined threshold, a logic state of the input 441 is changed from logic "1" to logic "0", causing the logic state of output Q2 to be changed from logic "0" to logic "1". The changed logic "1" of output Q2 turns ON transistor N2. With transistor N1 already turned ON by signal PU, a current path 445 is formed, by turned ON transistors N1, N2, through the pull-up detection assist circuit 440 to couple VSS to I/O terminal PAD. As a result, the voltage of I/O terminal PAD is quickly pulled to VSS, causing a corresponding quick or early change of the logic state of node CSI from logic "1" to logic "0". As described with respect to FIG. 3A, such a change of the logic state of node CSI is determined by the control circuit 450 as corresponding to detection of N-side damage.

In at least one embodiment, by monitoring the voltage at I/O terminal PAD (e.g., by coupling I/O terminal PAD to the input 441 of logic circuit NAND1) it is possible for the pull-up detection assist circuit 440 to detect a leakage current flowing between I/O terminal PAD and a power supply terminal (e.g., VSS). In response to detecting such leakage current, the current path 445 is formed through the pull-up detection assist circuit 440 to couple I/O terminal PAD to the power supply terminal (e.g., VSS). As a result, it is possible in one or more embodiments to quickly and surely change a voltage level (or a logic state) of I/O terminal PAD and the corresponding logic state of node CSI, which, in turn, improves at least one of speed, reliability, or sensitivity of the BIST circuit 400B, in accordance with some embodiments. The described logic circuit NOR1 and logic circuit NAND1 are examples. Other logic circuits configured to control the formation of a current path in response to a change of the voltage on I/O terminal PAD are within the scopes of various embodiments. The described current paths comprising two transistors, e.g., transistors P1, P2 or transistors N1, N2, are examples. Other numbers of transistors in a current path and/or other current path configurations are within the scopes of various embodiments.

Figure 4C:
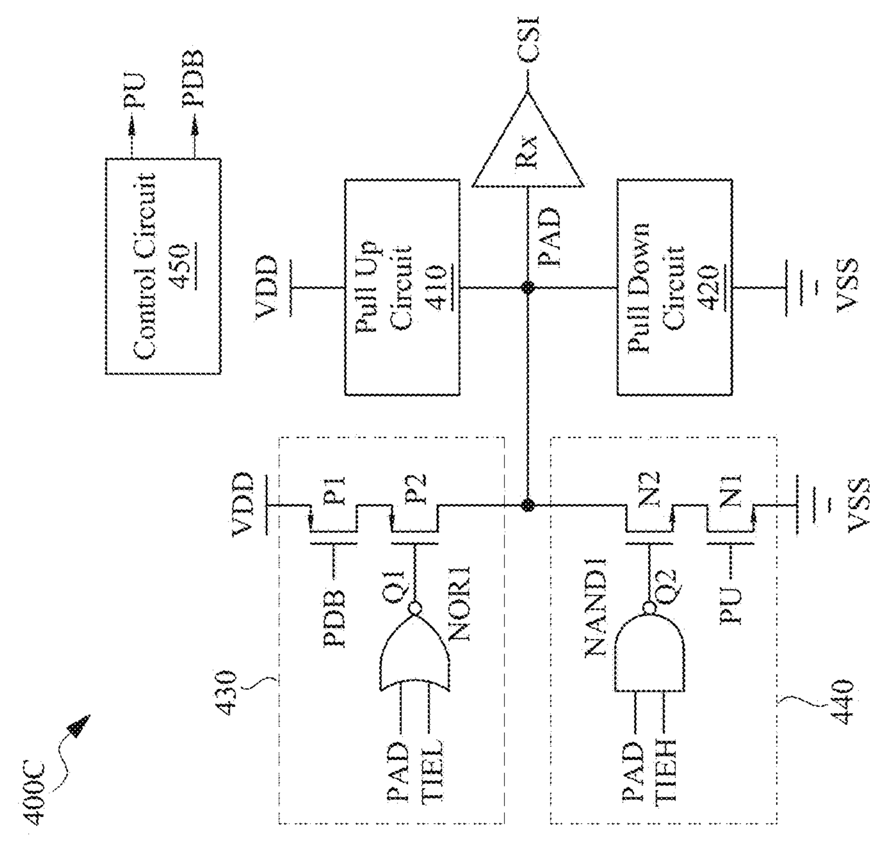

FIG. 4C is a schematic circuit diagram of a BIST circuit 400C, in accordance with some embodiments. In some embodiments, the BIST circuit 400C corresponds to one or more BIST circuits described with respect to FIGS. 1-2, 3A-3F.

The BIST circuit 400C comprises a pull-up circuit 410, a pull-down circuit 420, a pull-down detection assist circuit 430, a pull-up detection assist circuit 440, and a control circuit 450, as described with respect to FIGS. 4A-4B. The pull-up circuit 410, pull-down circuit 420, pull-down detection assist circuit 430, pull-up detection assist circuit 440 are coupled to the same I/O terminal PAD of an I/O circuit. For simplicity, input buffer Rx and node CSI of the I/O circuit are illustrated in FIG. 4C, whereas other components or circuits of the I/O circuit are omitted.

In a first BIST operation, e.g., an N-side checking BIST operation, the control circuit 450 is configured to disable the pull-down circuit 420 (e.g., by controlling a switch in the pull-down circuit 420 to be opened) and the pull-down detection assist circuit 430 (e.g., by supplying signal PDB having logic "1" to the gate of transistor P1). The control circuit 450 is configured to enable the pull-up circuit 410 (e.g., by controlling a switch in the pull-up circuit 410 to be closed), and the pull-up detection assist circuit 440 (e.g., by supplying signal PU having logic "1" to the gate of transistor N1). Detection of N-side damage by the enabled pull-up circuit 410, pull-up detection assist circuit 440 and the control circuit 450 is performed in accordance with some embodiments as described with respect to FIG. 4B.

In a second BIST operation, e.g., a P-side checking BIST operation, the control circuit 450 is configured to enable the pull-down circuit 420 (e.g., by controlling a switch in the pull-down circuit 420 to be closed) and the pull-down detection assist circuit 430 (e.g., by supplying signal PDB having logic "0" to the gate of transistor P1). The control circuit 450 is configured to disable the pull-up circuit 410 (e.g., by controlling a switch in the pull-up circuit 410 to be opened), and the pull-up detection assist circuit 440 (e.g., by supplying signal PU having logic "0" to the gate of transistor N1). Detection of P-side damage by the enabled pull-down circuit 420, pull-down detection assist circuit 430 and the control circuit 450 is performed in accordance with some embodiments as described with respect to FIG. 4A. One or more advantages described herein are achievable by one or more of the IC devices 400A-400C, in accordance with some embodiments.

Figure 4D:
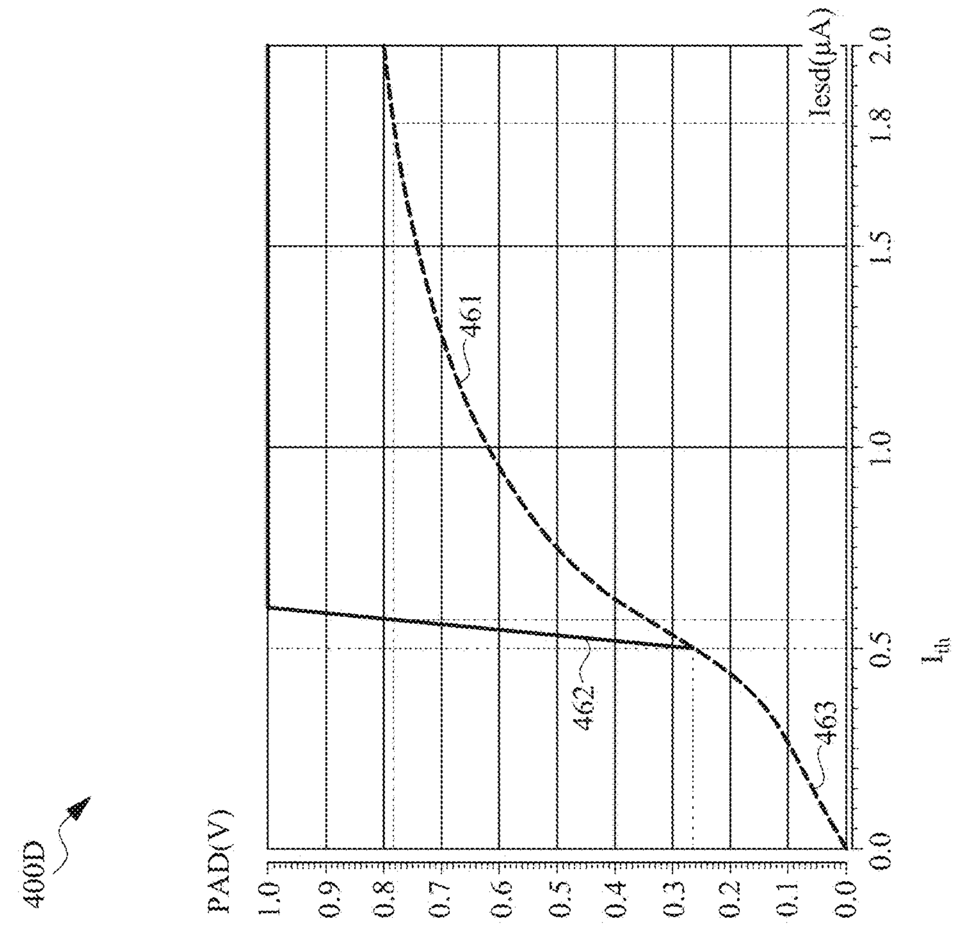
FIG. 4D is graph showing current-voltage relationships of an input/output (I/O) terminal in various circuit configurations, in accordance with some embodiments.

FIG. 4D is graph 400D showing non-limiting, example current-voltage relationships 461, 462 of an I/O terminal PAD, in accordance with some embodiments. In some embodiments, the relationship 461 corresponds to a BIST operation of the BIST circuit 400A when the pull-down detection assist circuit 430 is disabled, and the relationship 462 corresponds to a BIST operation of the BIST circuit 400A when the pull-down detection assist circuit 430 is enabled.

Each of the relationships 461, 462 is a relationship between a leakage current Iesd flowing from VDD to I/O terminal PAD, and a voltage of I/O terminal PAD. The relationships 461, 462 share a common section 463 corresponding to when Iesd starts flowing to I/O terminal PAD due to $I_{LP}>I_{PD}$, as described with respect to FIG. 4A. As Iesd rises, voltage PAD is also increased. When the pull-down detection assist circuit 430 is disabled, voltage PAD is slowly increased as shown at the relationship 462. In some situations, the increase of voltage PAD is not detectable (e.g., does not result in a change of the logic state at node CSI) until voltage PAD reaches about 80% of VDD, i.e., about 0.8 V, corresponding to Iesd reaching about 1.8 μA. It takes time for Iesd to rise to 1.8 μA, resulting in a somewhat "delayed" detection of leakage current and/or damage. In some situations, Iesd rises but does not reach 1.8 μA during a limited time window for the BIST operation, resulting in the damage, although existing, not being detected. Although the described concerns are acceptable in various situations, these concerns are addressable by enabling the pull-down detection assist circuit 430.

Specifically, with the pull-down detection assist circuit 430 being enabled, when Iesd reaches a threshold of about 0.5 μA corresponding to voltage PAD reaching about 0.27 V, this voltage level of voltage PAD is presented at the input

431 of logic circuit NOR1 of the pull-down detection assist circuit 430 and is sufficient to change the logic state of the input 431 from logic "0" to logic "1". As a result, the logic state of output Q1 of logic circuit NOR1 is changed from logic "1" to logic "0", turning ON transistor P2 and forming the current path 435 through the pull-down detection assist circuit 430. The formation of the current path 435 permits voltage PAD to be quickly pulled to VDD as can be seen in the relationship 462. Voltage PAD reaches the level of about 0.8 V for changing the logic state of node CSI when Iesd is about 0.6 μA, i.e., earlier than in the relationship 461 when the pull-down detection assist circuit 430 is disabled. In some embodiments, by enabling the pull-down detection assist circuit 430, damage and the corresponding Iesd are effectively detected when voltage PAD is in a range of about 0.2 V to 0.3 V, which enhances ESD-induced leakage detection accuracy to sub-μA level. Further, voltage PAD reaches the full logic "1" level of VDD for reliable switching of the logic state of node CSI and damage detection by the control circuit 450. This is an improvement over some situations, with the pull-down detection assist circuit 430 being disabled, where some uncertainty exists as I/O terminal PAD may not reach the full logic "1" level.

Relationships (not shown) similar to the relationships 461, 462 exist for a BIST operation of the BIST circuit 400B when the pull-up detection assist circuit 440 is disabled and when the pull-up detection assist circuit 440 is enabled. In at least one embodiment, by enabling the pull-up detection assist circuit 440, it is similarly possible to quickly detect damage and/or to enhance ESD-induced leakage detection accuracy to sub-μA level. Further, voltage PAD reaches the full logic "0" level of VSS for reliable switching of the logic state of node CSI and damage detection by the control circuit 450.

Figure 5A:
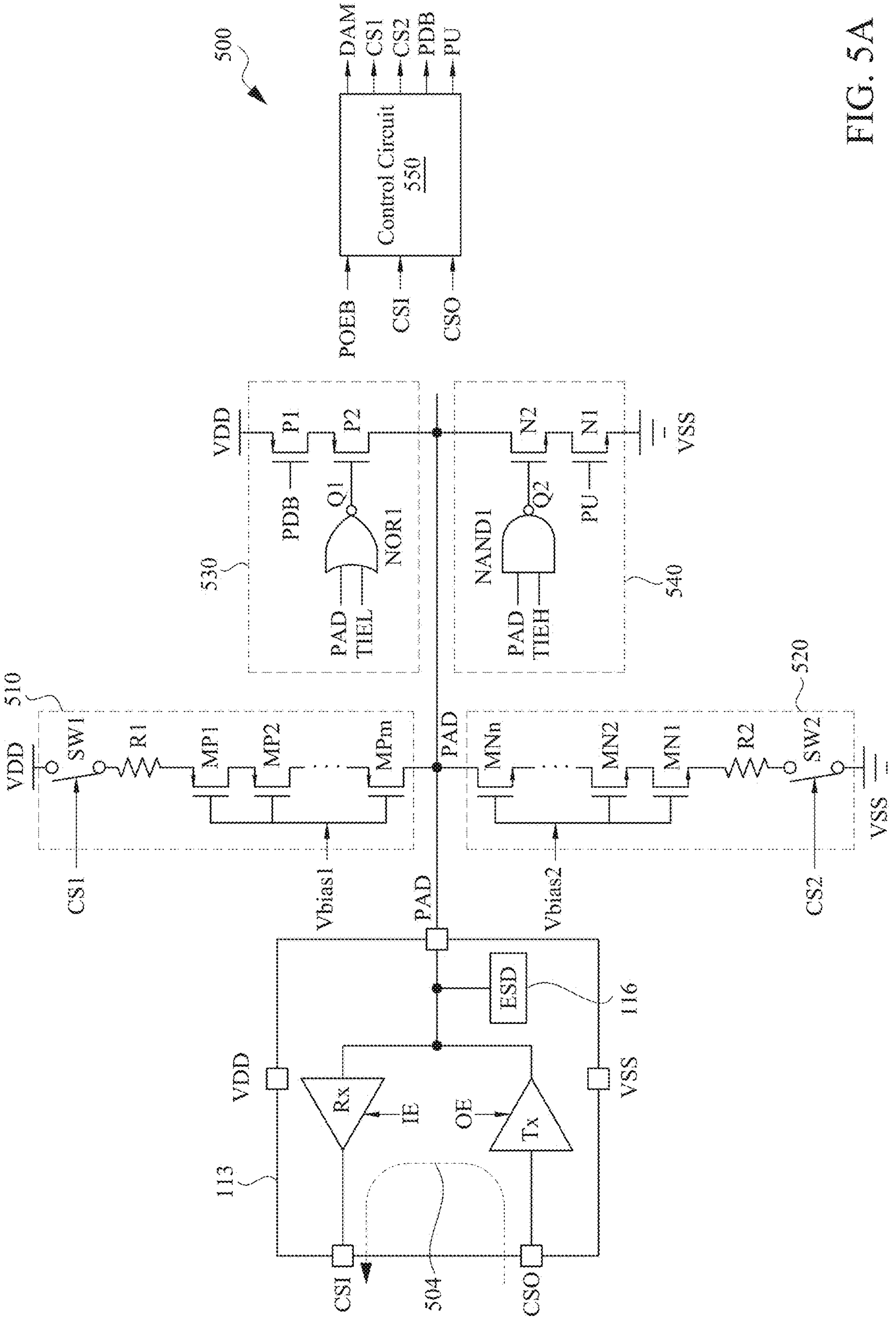
FIG. 5A is a schematic circuit diagram of a BIST circuit, in accordance with some embodiments.

FIG. 5A is a schematic circuit diagram of a BIST circuit 500, in accordance with some embodiments. In some embodiments, the BIST circuit 500 corresponds to one or more BIST circuits described with respect to FIGS. 1-2, 3A-3F, 4A-4C.

The BIST circuit 500 comprises a pull-up circuit 510, a pull-down circuit 520, a pull-down detection assist circuit 530, a pull-up detection assist circuit 540, and a control circuit 550. In some embodiments, the pull-up circuit 510 corresponds to the pull-up circuit 310, and/or the pull-down circuit 520 corresponds to the pull-down circuit 320, and/or the pull-down detection assist circuit 530 corresponds to the pull-down detection assist circuit 430, and/or the pull-up detection assist circuit 540 corresponds to the pull-up detection assist circuit 440, and/or the control circuit 550 corresponds to one or more of the control circuit 350, control circuit 450. The pull-up circuit 510, pull-down circuit 520, pull-down detection assist circuit 530, pull-up detection assist circuit 540 are coupled to I/O terminal PAD of the I/O circuit 113.

The control circuit 550 is configured to receive a control signal POEB which enables the BIST circuit 500 to perform one or more BIST operations. In some embodiments, signal POEB is generated by a circuit of an IC device comprising the BIST circuit 500, or by external testing equipment. The control circuit 550 is further coupled to node CSI, node CSO to receive the corresponding signals thereon. The control circuit 550 is configured to supply control signals CSI, CS2, PDB, PU to correspondingly control switch SW1 in the pull-up circuit 510, switch SW2 in the pull-down circuit 520, transistor P1 in the pull-down detection assist circuit 530, and transistor N1 in the pull-up detection assist circuit 540. The control circuit 550 is further configured to output one or more signals collectively designated as DAM indicating one or more of P-side damage, N-side damage, a P-side checking BIST operation is passed at the I/O circuit 113, an N-side checking BIST operation is passed at the I/O circuit 113. An arrow 504 in FIG. 5A indicates a signal path in a loopback mode, as described herein. One or more advantages described herein are achievable by the BIST circuit 500, in accordance with some embodiments.

Figure 5B:
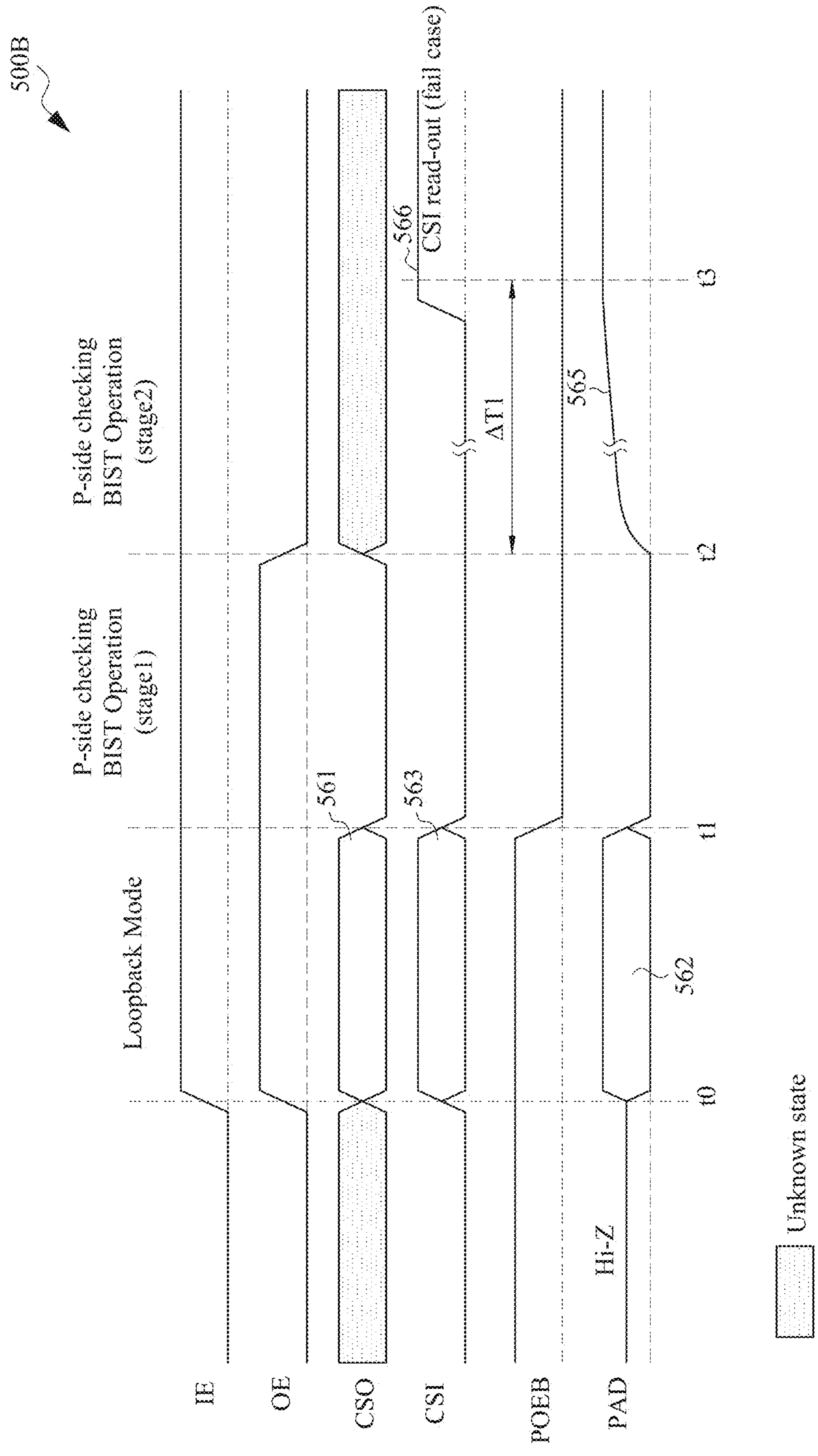
FIGS. 5B-5C are schematic timing diagrams showing various signals in operations of the BIST circuit of FIG. 5A, in accordance with some embodiments.

FIG. 5B is a schematic timing diagram showing various signals in a P-side checking BIST operation of the BIST circuit 500, in accordance with some embodiments.

In a time period before timing t0, I/O terminal PAD is placed in a Hi-Z (high resistance) state. For this purpose, input enable signal IE and output enable signal OE are controlled to have logic "0" which correspondingly disable input buffer Rx, output buffer Tx. Node CSO has a unknown state. Node CSI is at logic "0". Signal POEB is at logic "1", corresponding to the BIST circuit 500 not yet enabled to perform BIST operations.

At timing t0, the I/O circuit 113 enters a loopback mode. Output enable signal OE and input enable signal IE are switched to logic "1", and input buffer Rx and output buffer Tx are enabled. One or more signals 561 are output (e.g., by a functional circuit of the IC device comprising the BIST circuit 500) to node CSO, and are looped through output buffer Tx, I/O terminal PAD (as signals 562), input buffer Rx, and back at node CSI (as signals 563). Signal POEB remains at logic "1".

At timing t1, signal POEB is switched to logic "0", enabling the BIST circuit 500 to perform BIST operations. The BIST circuit 500 enters a first stage of a P-side checking BIST operation. The control circuit 550 enables the pull-down circuit 520, pull-down detection assist circuit 530, and disables the pull-up circuit 510, pull-up detection assist circuit 540, by supplying corresponding signals CS1, CS2, PDB, PU, as described herein. For example, signal CSI opens switch SW1, signal CS2 closes switch SW2, signal PDB has logic "0", signal PU has logic "0". The functional circuit (not shown) of the IC device outputs logic "0" to node CSO which is looped through output buffer Tx, I/O terminal PAD, input buffer Rx, and back at node CSI as described herein. As a result, I/O terminal PAD and node CSI have logic "0". Leakage currents, if present, on the P-side are not yet able to flow due to I/O terminal PAD being forcefully set at logic "0" by logic "0" at node CSO.

At timing t2, output enable signal OE is switched to logic "0", disabling output buffer Tx. The BIST circuit 500 enters a second stage of the P-side checking BIST operation. Because output buffer Tx is disabled, I/O terminal PAD is no longer forcefully set at logic "0". The voltage on I/O terminal PAD now depends on the enabled pull-down circuit 520 which attempts to maintain I/O terminal PAD at VSS or logic "0", and on any leakage current which may exist on the P-side and which attempts to raise the voltage of I/O terminal PAD towards VDD. This corresponds to the relationship of $I_{PD}$ and $I_{LP}$ as described with respect to FIG. 3B. When P-side leakage current is stronger than the pull-down circuit 520 (i.e., $I_{LP}>I_{PD}$), the voltage on I/O terminal PAD begins to rise, as schematically indicated at 565. When the voltage of I/O terminal PAD reaches a sufficient level, the logic state of node CSI is switched to logic "1", as indicated at 566. As described with respect to FIG. 4D, when the pull-down detection assist circuit 530 is enabled, node CSI is switched to logic "1" earlier than when pull-down detection assist circuit 530 is not enabled.

At timing t3, upon expiration of a predetermined time period ΔT1 from timing t2 when output buffer Tx is disabled, the control circuit 550 obtains the logic state of node CSI to determine whether P-side damage exists. ΔT1 is sometimes referred to as POEB-to-CSI waiting, and is configured to permit leakage currents to rise, and/or voltage PAD to change, to a level sufficient to cause switching of the logic state of node CSI. In at least one embodiment, ΔT1 is 1 μs. Other values of ΔT1 are within the scopes of various embodiments. In the example configuration in FIG. 5B, the logic state of node CSI is changed from logic "0" in the first stage to logic "1" in the second stage. This change is detected by the control circuit 550 which outputs a corresponding signal DAM indicating that the P-side checking BIST operation fails for I/O terminal PAD of the I/O circuit 113. When leakage current is not present, or is not stronger than the enabled pull-down circuit 520, or cannot reach, upon expiration of ΔT1, a level sufficient to cause switching of the logic state of node CSI, the logic state of node CSI remains unchanged at logic "0". This unchanged logic state of node CSI is detected by the control circuit 550 which outputs a corresponding signal DAM indicating that the P-side checking BIST operation passes for I/O terminal PAD of the I/O circuit 113.

Figure 5C:
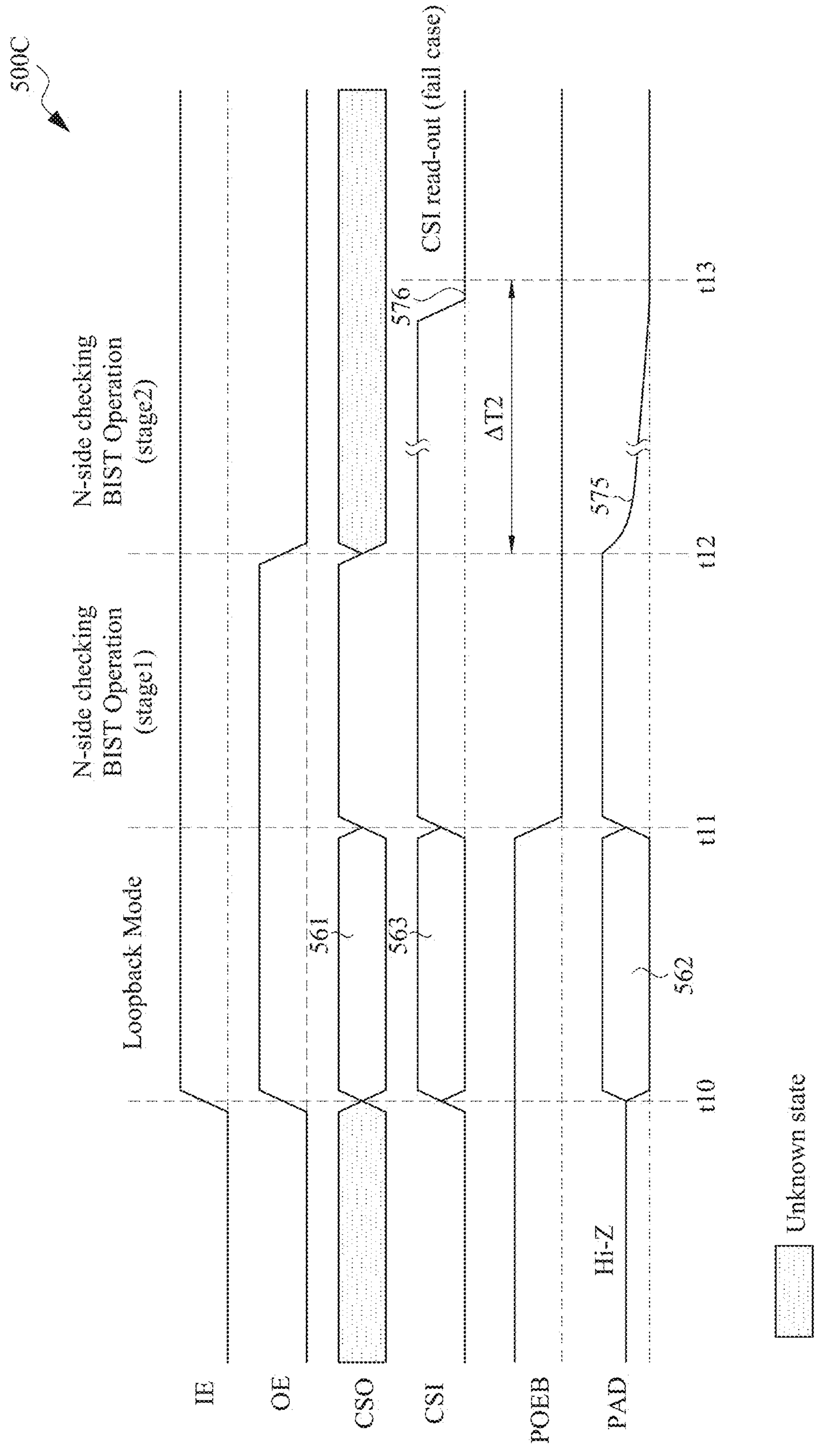

FIG. 5C is a schematic timing diagram showing various signals in a N-side checking BIST operation of the BIST circuit 500, in accordance with some embodiments.

The operation and logic states of the signals in the time period before timing t0 and during the loopback mode are similar to the P-side checking BIST operation described with respect to FIG. 5B.

At timing t11, signal POEB is switched to logic "0", enabling the BIST circuit 500 to perform BIST operations. The BIST circuit 500 enters a first stage of a N-side checking BIST operation. The control circuit 550 disables the pull-down circuit 520, pull-down detection assist circuit 530, and enables the pull-up circuit 510, pull-up detection assist circuit 540, by supplying corresponding signals CSI, CS2, PDB, PU, as described herein. For example, signal CSI closes switch SW1, signal CS2 opens switch SW2, signal PDB has logic "0", signal PU has logic "0". The functional circuit (not shown) of the IC device outputs logic "1" to node CSO which is looped through output buffer Tx, I/O terminal PAD, input buffer Rx, and back at node CSI as described herein. As a result, I/O terminal PAD and node CSI have logic "1". Leakage currents, if present, on the N-side are not yet able to flow due to I/O terminal PAD being forcefully set at logic "1" by logic "1" at node CSO.

At timing t12, output enable signal OE is switched to logic "0", disabling output buffer Tx. The BIST circuit 500 enters a second stage of the N-side checking BIST operation. Because output buffer Tx is disabled, I/O terminal PAD is no longer forcefully set at logic "1". The voltage on I/O terminal PAD now depends on the enabled pull-up circuit 510 which attempts to maintain I/O terminal PAD at VDD or logic "1", and on any leakage current which may exist on the N-side and which attempts to decreases the voltage of I/O terminal PAD towards VSS. This corresponds to the relationship of $I_{PU}$ and $I_{LN}$ as described with respect to FIG. 3A. When N-side leakage current is stronger than the pull-up circuit 510 (i.e., $I_{LN}>I_{PU}$), the voltage on I/O terminal PAD begins to drop, as schematically indicated at 575. When the voltage of I/O terminal PAD reaches a sufficient level, the logic state of node CSI is switched to logic "0", as indicated at 576. In a manner similar to that described with respect to FIG. 4D, when the pull-up detection assist circuit 540 is enabled, node CSI is switched to logic "0" earlier than when pull-up detection assist circuit 540 is not enabled.

At timing t13, upon expiration of a predetermined time period ΔT2 from timing T12 when output buffer Tx is disabled, the control circuit 550 obtains the logic state of node CSI to determine whether N-side damage exists. In at least one embodiment, ΔT2 is the same as ΔT1. In some embodiments, ΔT2 is different from ΔT1. In the example configuration in FIG. 5C, the logic state of node CSI is changed from logic "1" in the first stage to logic "0" in the second stage. This change is detected by the control circuit 550 which outputs a corresponding signal DAM indicating that the N-side checking BIST operation fails for I/O terminal PAD of the I/O circuit 113. When leakage current is not present, or is not stronger than the enabled pull-up circuit 510, or cannot reach, upon expiration of ΔT2, a level sufficient to cause switching of the logic state of node CSI, the logic state of node CSI remains unchanged at logic "1". This unchanged logic state of node CSI is detected by the control circuit 550 which outputs a corresponding signal DAM indicating that the N-side checking BIST operation passes for I/O terminal PAD of the I/O circuit 113.

The example operations described with respect to FIGS. 5B, 5C are examples of BIST operations for a known good die (KGD), in accordance with some embodiments. A KGD is an individual die or IC device that, before packaging, has undergone various testing operations and is confirmed to be functional and/or to meet specific quality standards. This concept is in contrast to known good stacking (KGS) which refers to the successful stacking of multiple KGDs together in a specific configuration, e.g., 2.5D or 3D IC. Although all individual dies are known good (KGDs), issues during the stacking process potentially lead to malfunctions and various testing operations are performed to confirm whether the stacking of multiple KGDs is good or not. Examples of BIST operations for KGSs, in accordance with some embodiments, are described with respect to FIG. 7A, 7B.

Figure 6A:
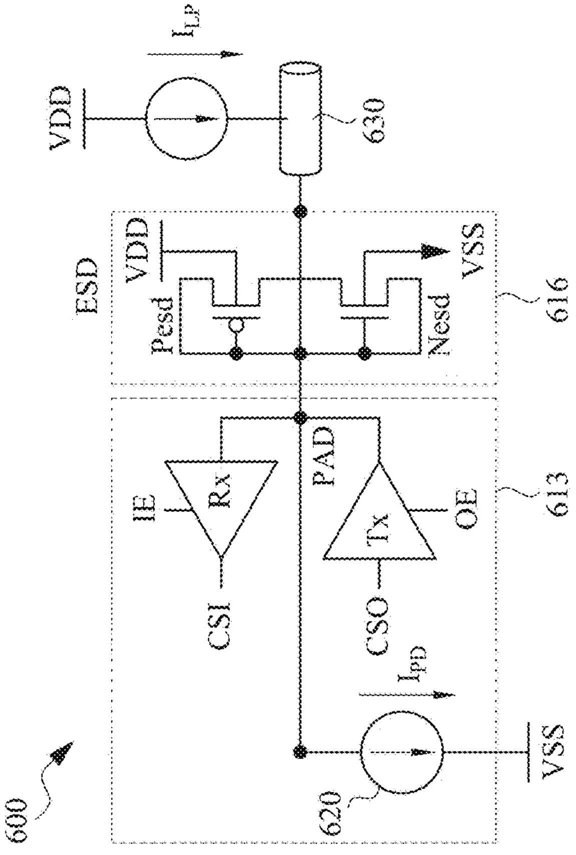
FIGS. 6A-6B are schematic circuit diagrams of an IC device in various BIST operations, in accordance with some embodiments.
Figure 6B:
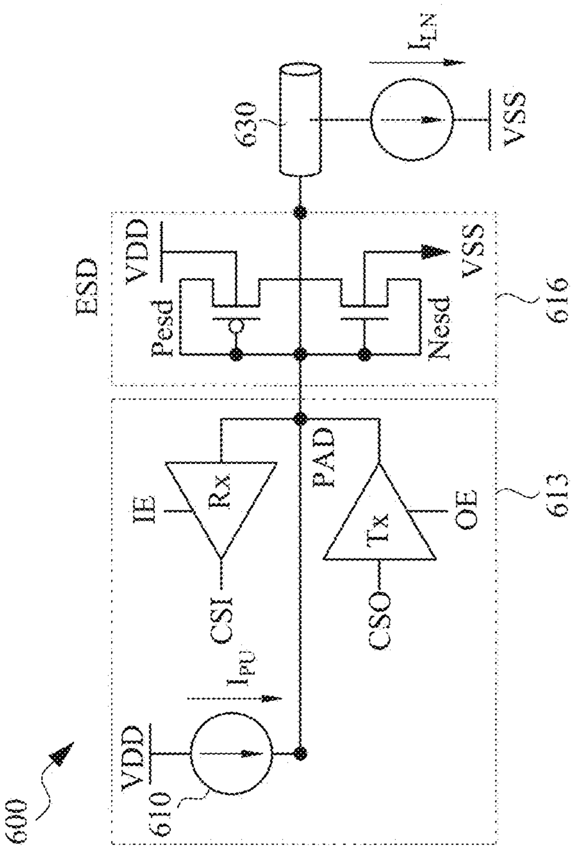

FIGS. 6A-6B are schematic circuit diagrams of an IC device 600 in various BIST operations, in accordance with some embodiments. In some embodiments, the IC device 600 corresponds one or more of the IC devices 110, 120 and/or IC devices including BIST circuits described with respect to FIGS. 3A-3F, 4A-4C, 5A.

The IC device 600 comprises a functional circuit (not shown), an interface circuit 613 configured to input/output data/signals to/from the functional circuit, and an ESD protection circuit 616. The interface circuit 613 comprises an I/O circuit comprising input buffer Rx, output buffer Tx and I/O terminal PAD as described herein. The interface circuit 613 further comprises a BIST circuit corresponding to one or more of the BIST circuits described with respect to FIGS. 1-2, 3A-3F, 4A-4C, 5A. The BIST circuit is partially and schematically shown in FIGS. 6A-6B. For example, the BIST circuit comprises a pull-down circuit 620 schematically represented in FIG. 6A as a current source of $I_{PD}$, and a pull-up circuit 610 schematically represented in FIG. 6B as a current source of $I_{PU}$. In some embodiments, the BIST circuit further comprises one or more of a pull-down detection assist circuit, a pull-up detection assist circuit, a control circuit, as described herein.

The ESD protection circuit 616 is coupled to I/O terminal PAD of the interface circuit 613. In the example configuration in FIGS. 6A, 6B, the ESD protection circuit 616 comprises a P-type transistor Pesd, and an N-type transistor Nesd. Gates and sources of transistors Pesd, Nesd are coupled together and to I/O terminal PAD. Drains of transistors Pesd, Nesd are coupled together. Bodies of transistors Pesd, Nesd are correspondingly coupled to VDD and VSS.

The described configuration is an example. Other ESD protection circuit configurations are within the scopes of various embodiments.

An interface structure 630 is coupled to I/O terminal PAD of the IC device 600 for subsequent bonding/coupling to a further die. In the stage in FIGS. 6A, 6B, the further die is not yet stated/and/or bonded to the IC device 600. In some embodiments, the interface structure 630 corresponds to the interface structure 130, and comprises one or more of TSVs, hybrid bumps, ubumps, or the like.

In some situations, the ESD protection circuit 616 and/or interface structure 630 are potential sources of various types of damage. For example, the ESD protection circuit 616 is a potential source of ESD-induced soft failures. In some embodiments, BIST operations are performed by the BIST circuit of the IC device 600 to detect damage not only in the I/O circuit (e.g., input buffer Rx and/or output buffer Tx), but also in ESD protection circuit 616 and/or interface structure 630.

FIG. 6A is a schematic circuit diagrams of the IC device 600 in a P-side checking BIST operation to detect leakage currents to VDD, in accordance with some embodiments. Potential sources of leakage currents include one or more P-type transistors of the I/O circuit and/or the ESD protection circuit 616, as well as the interface structure 630. In the example configuration in FIG. 6A, a leakage current occurs between VDD and interface structure 630, and is schematically represented as $I_{LP}$. A relationship between $I_{LP}$ and $I_{PD}$ is detected, through the voltage of I/O terminal PAD and/or a logic state of node CSI, by the control circuit of the BIST circuit to determine whether P-side damage is present, as described herein.

FIG. 6B is a schematic circuit diagrams of the IC device 600 in an N-side checking BIST operation to detect leakage currents to VSS, in accordance with some embodiments. Potential sources of leakage currents include one or more N-type transistors of the I/O circuit and/or the ESD protection circuit 616, as well as the interface structure 630. In the example configuration in FIG. 6B, a leakage current occurs between VSS and interface structure 630, and is schematically represented as $I_{LN}$. A relationship between $I_{LN}$ and $I_{PU}$ is detected, through the voltage of I/O terminal PAD and/or the logic state of node CSI, by the control circuit of the BIST circuit to determine whether N-side damage is present, as described herein. The example operations described with respect to FIGS. 6A, 6B are further examples of BIST operations for KGDs, in accordance with some embodiments. One or more advantages described herein are achievable by the IC device 600, in accordance with some embodiments.

Figure 7A:
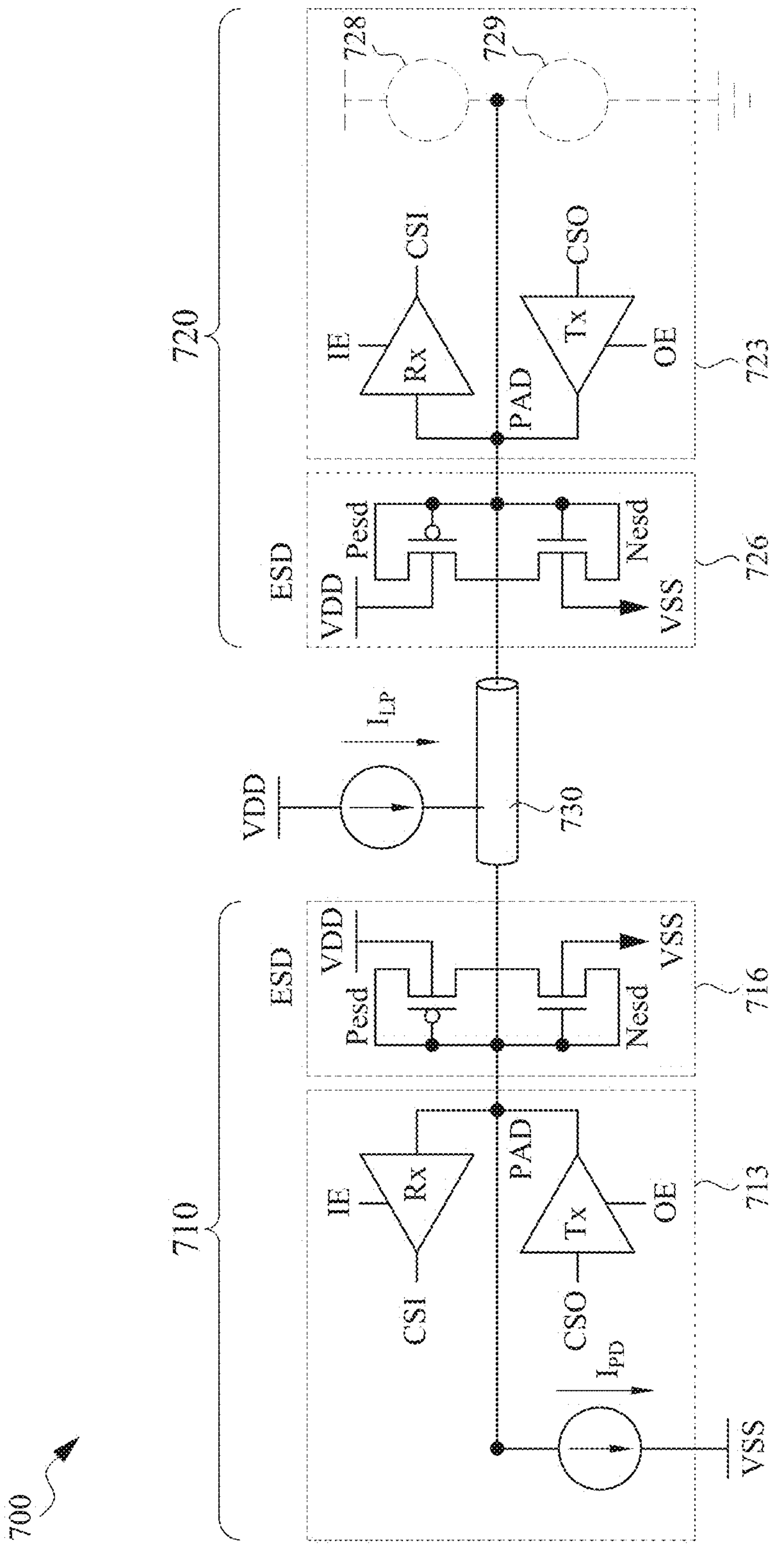
FIGS. 7A-7B are schematic circuit diagrams of a semiconductor device in various BIST operations, in accordance with some embodiments.
Figure 7B:
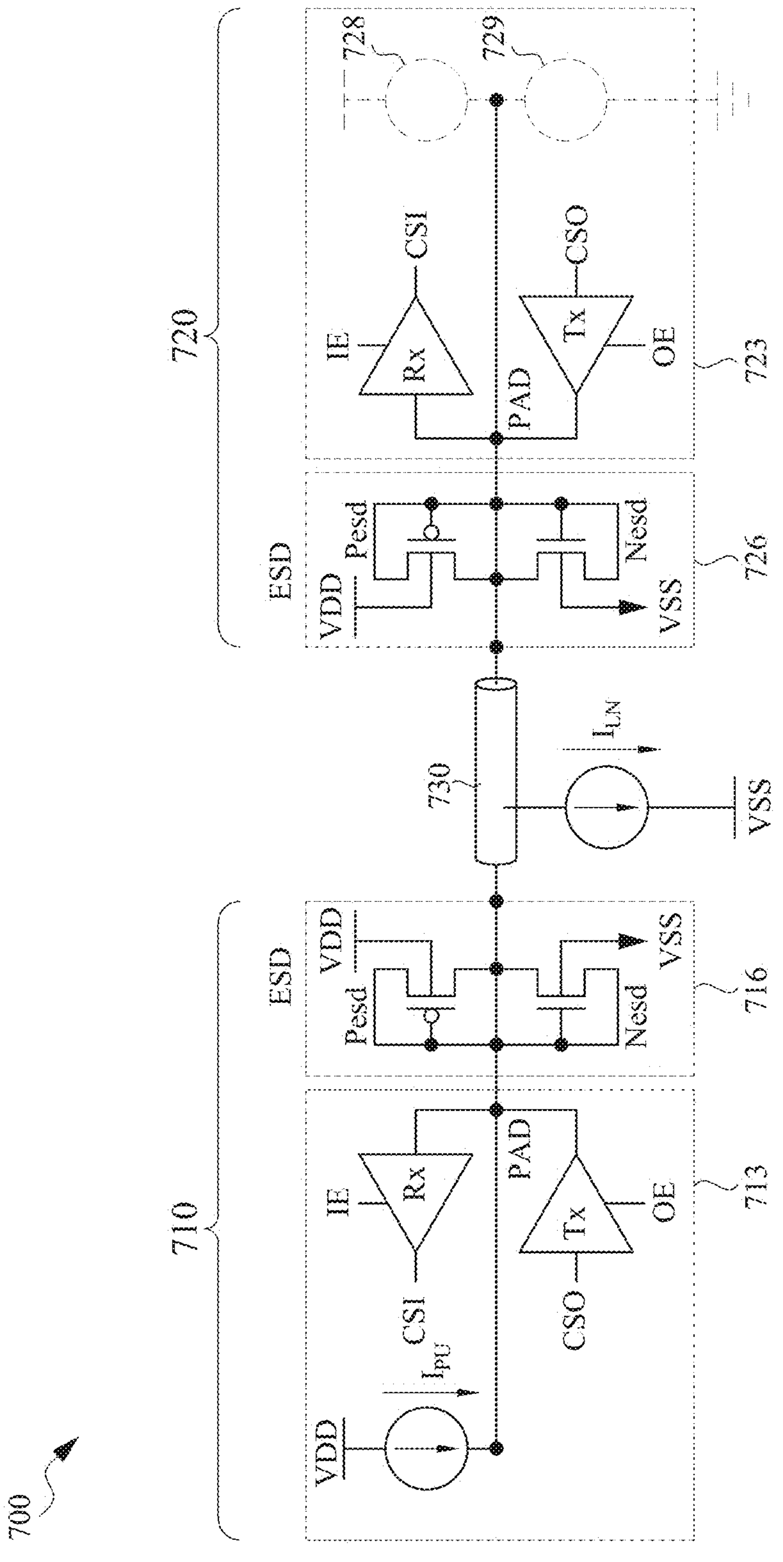

FIGS. 7A-7B are schematic circuit diagrams of a semiconductor device 700 in various BIST operations, in accordance with some embodiments. In some embodiments, the semiconductor device 700 corresponds to the semiconductor device 100.

The semiconductor device 700 comprises IC devices 710, 720 electrically and/or physically coupled to each other by an interface structure 730. In some embodiments, one or more of IC devices 710, 720 correspond to the IC devices 110, 120, 600, and/or IC devices including BIST circuits described with respect to FIGS. 3A-3F, 4A-4C, 5A. In at least one embodiment, the interface structure 730 corresponds to one or more of the interface structures 130, 630. In the example configuration in FIGS. 7A, 7B, the IC device 710 is configured similarly to the IC device 600, and comprises a functional circuit (not shown), an interface circuit 713 corresponding to the interface circuit 613, and an ESD protection circuit 716 corresponding to the ESD protection circuit 616. The IC device 720 is also configured similarly to the IC device 600, and comprises a functional circuit (not shown), an interface circuit 723 corresponding to the interface circuit 613, and an ESD protection circuit 726 corresponding to the ESD protection circuit 616. The interface structure 730 couples I/O terminal PAD of the interface circuit 713 to I/O terminal PAD of the interface circuit 723

During BIST operations of one of the IC devices 710, 720, the other IC device is set in a Hi-Z state. For example, during BIST operations of the IC device 710, input buffer Rx and output buffer Tx in the interface circuit 723 of the IC device 720 are disabled by corresponding output enable signal OE and input enable signal IE having logic "0". Further, a pull-up circuit 728 and a pull-down circuit 729 of a BIST circuit in the interface circuit 723 are disabled by, e.g., controlling corresponding switches in the pull-up circuit 728 and a pull-down circuit 729 to be opened. With the IC device 720 being in the Hi-Z state, a P-side checking BIST operation is performed in the IC device 710 as schematically shown in FIG. 7A and/or as described with respect to FIG. 6A. Further, with the IC device 720 being in the Hi-Z state, an N-side checking BIST operation is performed in the IC device 710 as schematically shown in FIG. 7B and/or as described with respect to FIG. 6B. The example operations described with respect to FIGS. 7A, 7B are examples of BIST operations for KGSs, in accordance with some embodiments. One or more advantages described herein are achievable by the IC device 700, in accordance with some embodiments.

Figure 8B:
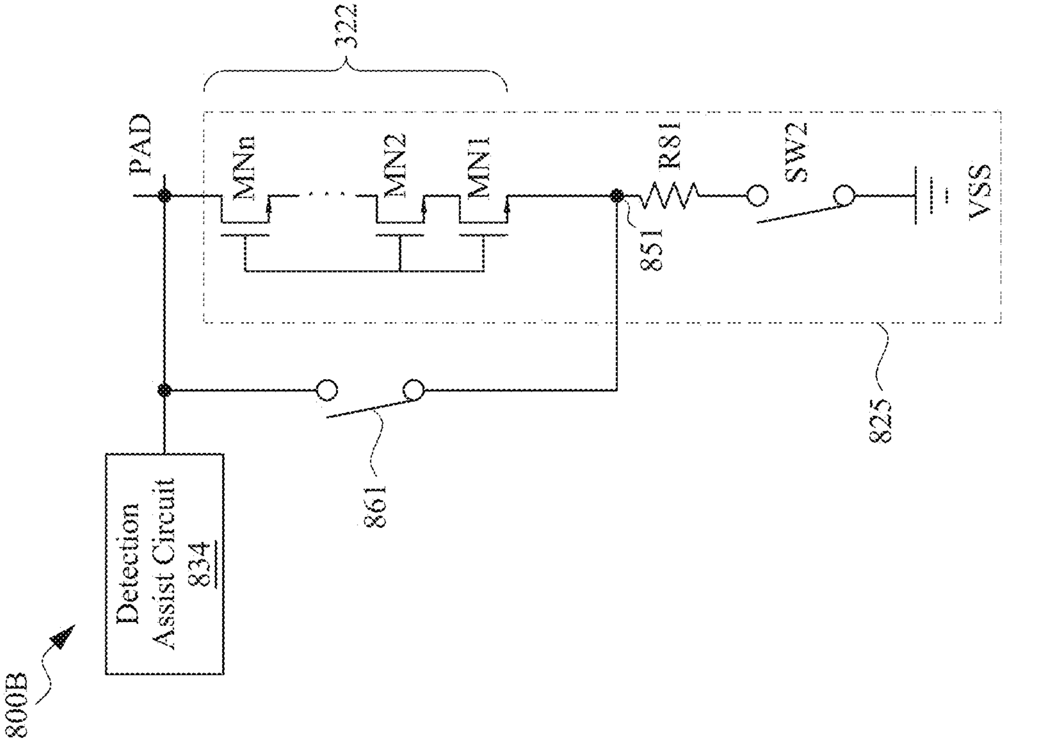
FIGS. 8A-8C are schematic circuit diagrams of various BIST circuits, in accordance with some embodiments.
Figure 8A:
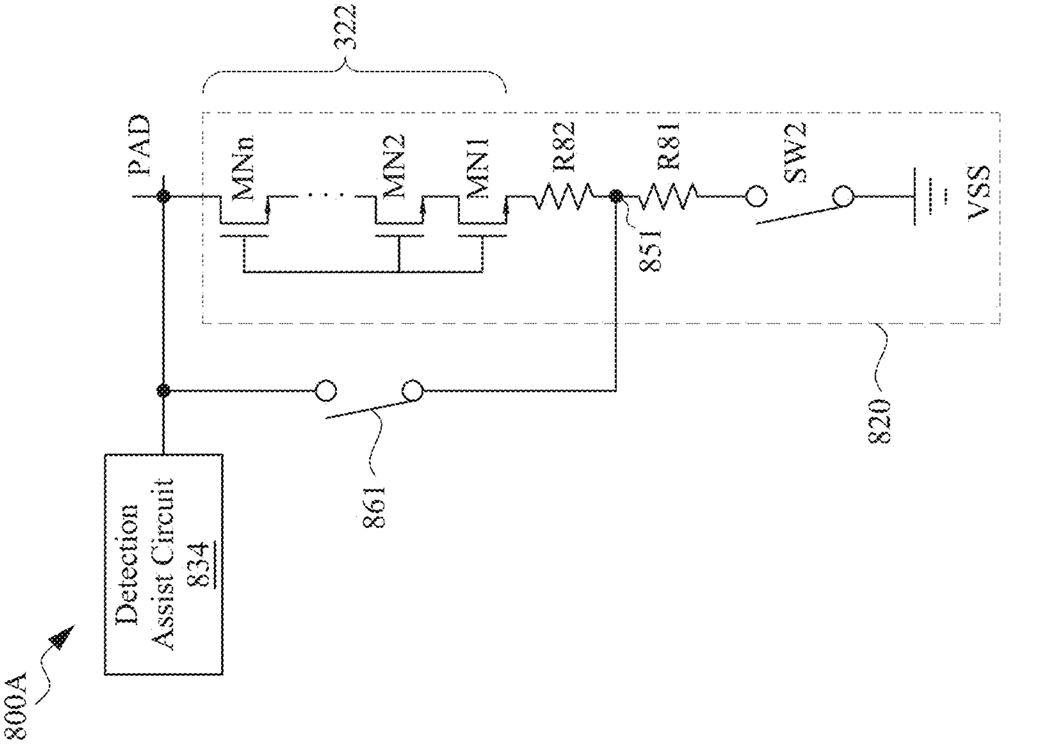
Figure 8C:
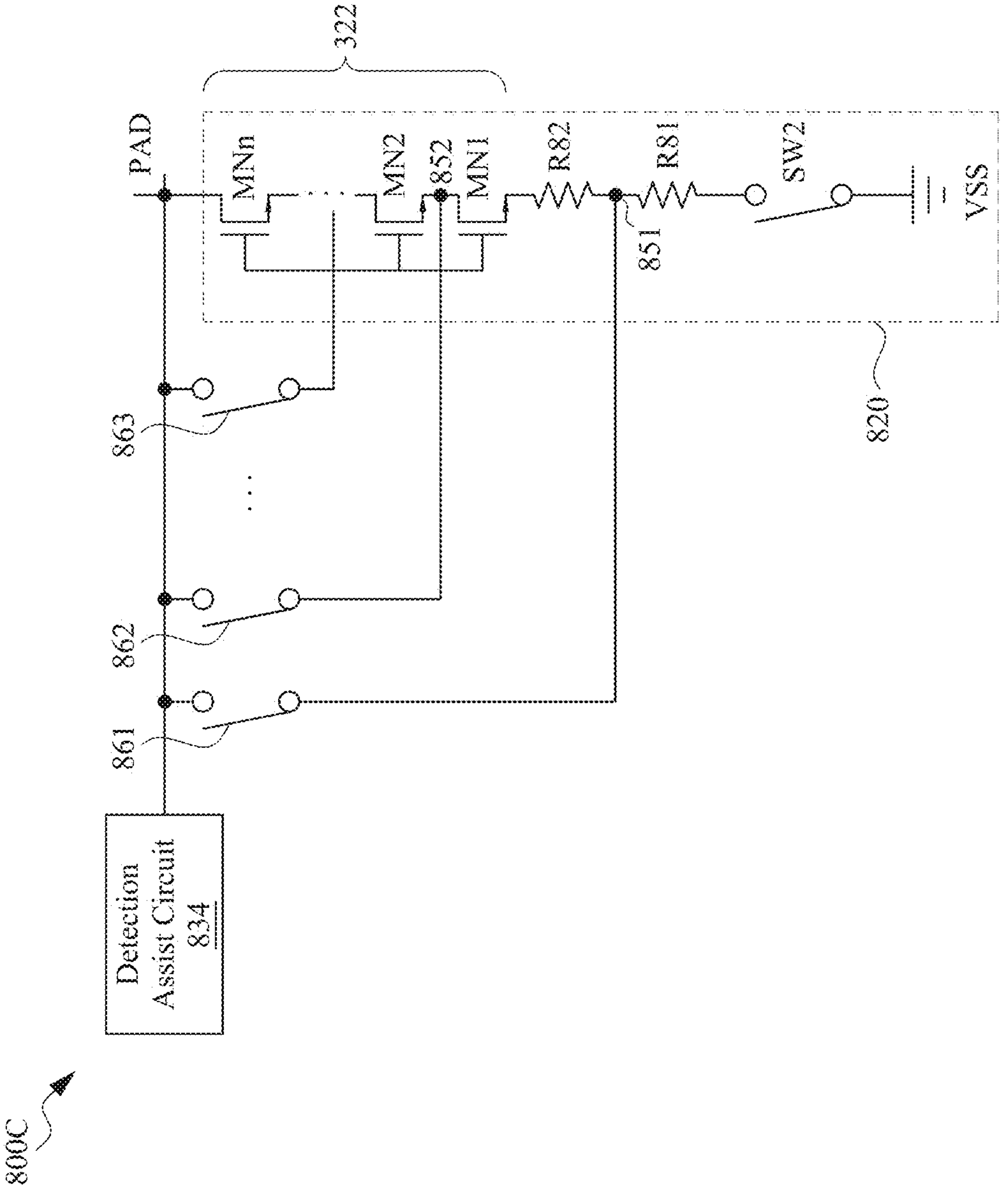

FIGS. 8A-8C are schematic circuit diagrams of various BIST circuits 800A-800C, in accordance with some embodiments. In some embodiments, one or more of the BIST circuits 800A-800C correspond to one or more BIST circuits described with respect to FIGS. 1-2, 3A-3F, 4A-4C, 5A, 6A-6B, 7A-7B.

In FIG. 8A, the BIST circuit 800A comprises a pull-down circuit 820, and a detection assist circuit 834 both of which are coupled to an I/O terminal PAD of an I/O circuit. For simplicity, input buffer Rx and output buffer Tx of the I/O circuit are omitted. In some embodiments, the BIST circuit 800A further comprises a pull-up circuit and a control circuit. The detection assist circuit 834 comprises one or more of a pull-down detection assist circuit and a pull-up detection assist circuit as described with respect to FIGS. 2, 4A-4C, 5A. The pull-down circuit 820 is similar to the pull-down circuit 320, with a difference being that resistor R2 of the pull-down circuit 320 is divided into two resistors R81, R82 in the pull-down circuit 820. The BIST circuit 800A further comprises a switch 861 coupling a node 851 between resistors R81, R82 to I/O terminal PAD. The control circuit (not shown) of the BIST circuit 800A is coupled to control the switch 861 to close or open.

When switch 861 is opened, the pull-down circuit 820 is the same as the pull-down circuit 320, and the BIST circuit 800A is configured to detect leakage currents at a level of $I_{PD}$ corresponding to the total resistance of a transistor string 322 and resistors R81, R82 (i.e., R81+R82=R2).

When the switch 861 is closed, the transistor string 322 and resistor R82 of the pull-down circuit 820 are bypassed. As a result, in a BIST operation when switch SW2 is closed, the pull-down circuit 820 effectively includes resistor R81 between I/O terminal PAD and VSS. Because a resistance of resistor R81 is smaller than the total resistance of the transistor string 322 and resistors R81, R82, the BIST circuit 800A with the switch 861 closed is configured to detect leakage currents larger than when the switch 861 is opened.

In a non-limiting example, when the switch 861 is closed, the BIST circuit 800A is configured to detect leakage currents at 1 μA and above, whereas when the switch 861 is opened, the BIST circuit 800A is configured to detect leakage currents at 0.25 μA and above. These different reference currents (i.e., 1 μA, 0.25 μA) correspond to different BIST sensitivities of the BIST circuit 800A.

By selectively closing or opening the switch 861, it is possible to adjust the BIST sensitivity of the BIST circuit 800A to detect leakage currents of different magnitudes corresponding to different types of damage. For example, in a first run of a BIST operation, the switch 861 is closed, and the BIST circuit 800A with the closed switch 861 is configured to detect, with a higher reference current, leakage currents which are relatively large and correspond to a more serious type of damage. If such a more serious type of damage is detected by the BIST circuit 800A, the IC device comprising the BIST circuit 800A is repaired or even rejected from being used in subsequent manufacturing processes. If the IC device passes the first run of the BIST operation, a second run of the BIST operation is performed, with the switch 861 opened. The BIST circuit 800A with the opened switch 861 is configured to detect, with a smaller reference current, leakage currents which are relatively small and correspond to a less serious type of damage which, if found, is tolerable and/or addressable without rejecting the IC device. For example, a less serious type of damage found in an IC device is addressable by software, and/or by adjustment of the nominal operating voltage and/or frequency of the IC device, and/or by using the IC device in a less- or non-critical IC package and/or application. One or more advantages described herein are achievable by the BIST circuit 800A, in accordance with some embodiments.

In FIG. 8B, the BIST circuit 800B is similar to the BIST circuit 800A, with a difference being that resistor R82 in the pull-down circuit 820 of the BIST circuit 800A is omitted in a corresponding pull-down circuit 825 of the BIST circuit 800B. In an alternative configuration, a pull-down circuit similar to the pull-down circuit 825 is obtainable in accordance with some embodiments when the switch 861 is coupled to I/O terminal PAD and a node between the transistor string 322 and resistor R2 in the pull-down circuit 320. By selectively closing or opening the switch 861, it is possible to adjust the BIST sensitivity of the BIST circuit 800B in a manner similar to the BIST circuit 800A. One or more advantages described herein are achievable by the BIST circuit 800B, in accordance with some embodiments.

In FIG. 8C, the BIST circuit 800C 800B is similar to the BIST circuit 800A, with a difference being that the BIST circuit 800C additionally comprises switches 862, 863. Each of the switches 862, 863 is coupled to I/O terminal PAD and a node between adjacent transistors in the transistor string 322. For example, the switch 862 is coupled to a node 852 between adjacent transistors Mn1, Mn2 in the transistor string 322. The switches 861~863 are coupled to and controlled by a control circuit (not shown) of the BIST circuit 800C. By selectively closing or opening one or more of the switches 861~863, it is possible to adjust the BIST sensitivity of the BIST circuit 800C in various ways similar to the BIST circuit 800A. One or more advantages described herein are achievable by the BIST circuit 800C, in accordance with some embodiments.

Figure 9:
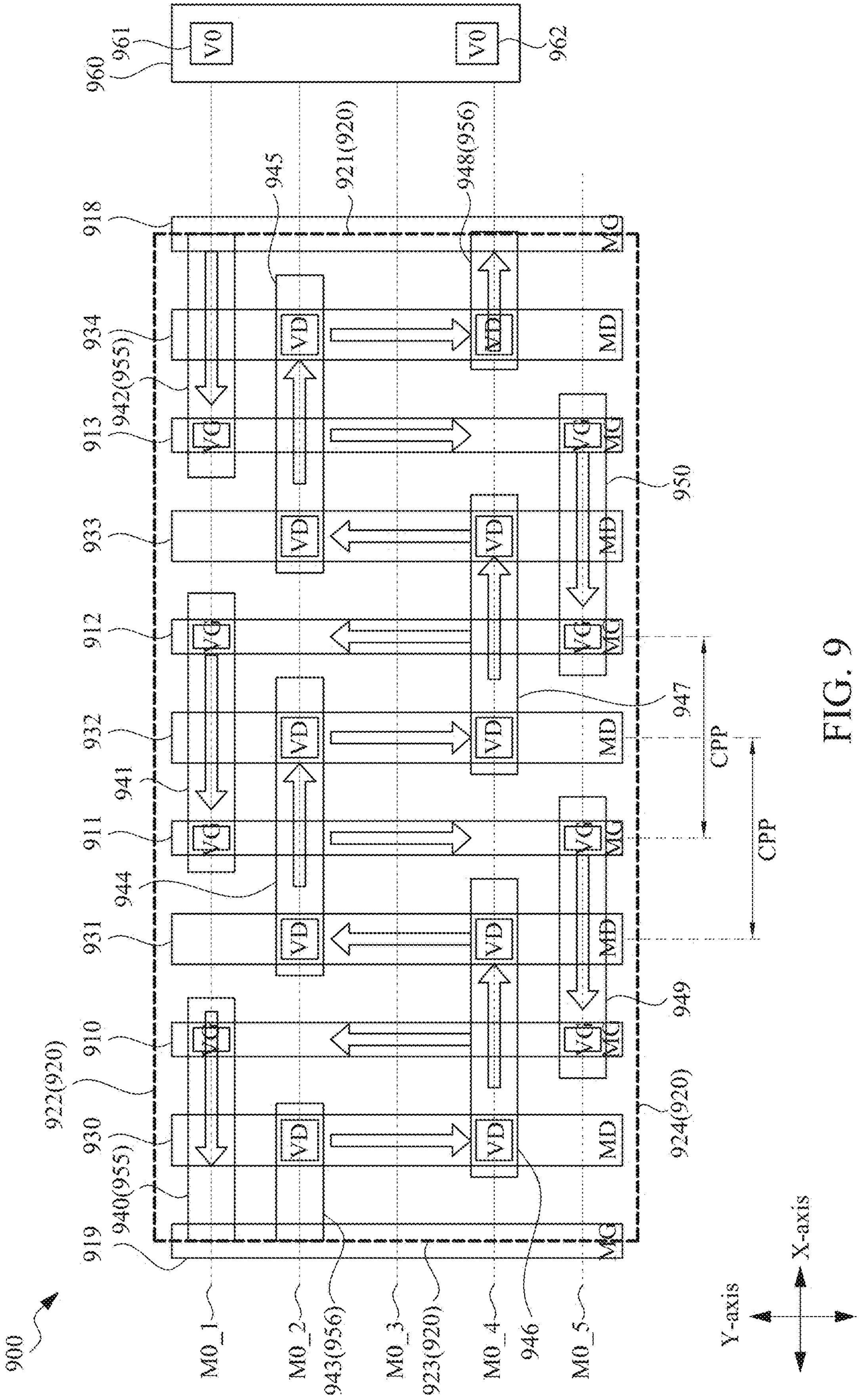
FIG. 9 is a schematic of a layout of a resistor cell, in accordance with some embodiments.

FIG. 9 is a schematic of a layout of a resistor cell 900, in accordance with some embodiments. In some embodiments, the resistor cell 900 corresponds to a resistive region that constitutes one or more resistors described herein, such as resistor R1, resistor R2, resistors of the bias voltage generation circuit 302, resistors R81, R82, or the like.

An IC device includes one or more circuit elements represented in an IC layout diagram (also referred to as "IC design layout diagram," "layout diagram," "IC layout," or "layout"). A layout is hierarchical and includes modules which carry out higher-level functions in accordance with the device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. The resistor cell 900 is an example of such cells. In at least one embodiment, the resistor cell 900 is stored in a cell library on a non-transitory computer-readable medium.

The resistor cell 900 comprises a boundary 920 in which active regions (not shown) and gate regions 910-913, 918-919 are arranged. The active regions (not shown) extend along a first axis, i.e., X-axis. Active regions are sometimes referred to as oxide-definition (OD) regions. In an IC device comprising the resistor cell 900 in accordance with at least one embodiment, the active regions are over a first side, or a front side, of a substrate as described herein. The active regions include P-type dopants and/or N-type dopants to form one or more circuit elements, such as various types of transistors as described herein. An active region configured to form one or more PMOS devices is referred to herein as a "PMOS active region." An active region configured to form one or more NMOS devices is referred to herein as an "NMOS active region."

The boundary 920 comprises edges 921, 922, 923, 924 connected together to form a closed boundary. In a place-and-route operation (also referred to as "automated placement and routing (APR)") described herein, cells are placed in an IC layout in abutment with each other at their respective boundaries. For example, the resistor cell 900 is placed in abutment with one or more other instances of the resistor cell 900 along the X-axis at one or more of the edges 921, 923. Additionally or alternatively, the resistor cell 900 is placed in abutment with one or more other instances of the resistor cell 900 along the Y-axis at one or more of the edges 922, 924. The boundary 920 is sometimes referred to as "place-and-route boundary." The edges 921, 922, 923, 924 of the boundary 920 are sometimes referred to as boundary lines. In the example configuration in FIG. 9, the boundary 920 has a rectangular shape, with the edges 921, 923 parallel to the Y-axis, and the edges 922, 924 parallel to the X-axis. Other configurations are within the scopes of various embodiments. For example, in one or more embodiments, the boundary 920 has a shape other than a rectangle shape and/or one or more edges of the boundary 920 are oblique with respect to the X-axis and the Y-axis.

Each of the gate regions 910-913, 918-919 extends across the active regions along a second axis, i.e., Y-axis, which is transverse to the X-axis. In at least one embodiment, the Y-axis is perpendicular to the X-axis. The gate regions 910-913, 918-919 include a conductive material, such as, metal, and are schematically illustrated in the drawings with the label "MG." Other conductive materials for the gate region, such as polysilicon, are within the scope of various embodiments.

The gate regions 918, 919 are along the corresponding edges 921, 923 of the boundary 920. In at least one embodiment, centerlines of the gate regions 918, 919 coincide with the corresponding edges 921, 923 of the boundary 920. The gate regions 910-913, 918-919 are arranged at the same pitch CPP, i.e., a center-to-center distance, along the X-axis. In a place-and-route operation when the resistor cell 900 is placed to abut other cells, the gate regions 918, 919 along the edges 921, 923 of the boundary 920 are merged with corresponding gate regions of the other cells. Other configurations are within the scopes of various embodiments. For example, in one or more embodiments, one or more of the edges 921, 923 of the boundary 920 are not arranged along the gate regions 918, 919.

The resistor cell 900 further comprises contact structures over and in electrical contact with corresponding source/drain regions in the active regions. Contact structures are sometimes referred to as metal-to-device structures, and are schematically illustrated in the drawings with the label "MD." An MD contact structure includes a conductive material formed over a corresponding source/drain region in the corresponding active region to define an electrical connection from one or more devices formed in the active region to other circuitry. In the example configuration in FIG. 9, MD contact structures 930-934 extend continuously along the Y-axis to be over and in electrical contact with the underlying active regions. MD contact structures and gate regions are arranged alternatingly along the X-axis. A pitch, i.e., a center-to-center distance along the X-axis, between immediately adjacent MD contact structures is the same as the pitch CPP between immediately adjacent gate regions. An example conductive material of MD contact structures includes metal. Other configurations are within the scopes of various embodiments.

The resistor cell 900 further comprises vias over and in electrical contact with the corresponding gate regions or MD contact structures. A via over and in electrical contact with an MD contact structure is sometimes referred to as via-to-device (VD) and is schematically illustrated in the drawings with the label "VD." A via over and in electrical contact with a gate region is sometimes referred to as via-to-gate (VG) and is schematically illustrated in the drawings with the label "VG." An example material of VD and VG vias includes metal. Other configurations are within the scopes of various embodiments.

The resistor cell 900 further comprises one or more metal layers and via layers sequentially and alternatingly arranged over the VD and VG vias. The lowermost metal layer immediately over and in electrical contact with the VD and VG vias is a metal-zero (M0) layer. In other words, the M0 layer is the lowermost metal layer over, or the closest metal layer to, the active regions on the front side of the substrate. A next metal layer immediately over the M0 layer is a metal-one (M1) layer, or the like. Conductors in the M0 layer are referred to herein as M0 conductors, conductors in the M1 layer are referred to herein as M1 conductors, or the like. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer. Other via layers are V1, V2, or the like. Metal layers, such as M0, M1, or the like, and via layers, such as V0, V1, or the like, on the front side of the substrate are referred to herein as front side metal layers and front side via layers.

In the example configuration in FIG. 9, the resistor cell 900 comprises, in the M0 layer, various M0 conductors 940-950 along corresponding tracks M0_1, M0_2, M0_3, M0_4, M0_5. In some embodiments, M0 conductors in the M0 layer belong to the same mask. In at least one embodiment, M0 conductors in the M0 layer are separated into several masks to meet one or more design and/or manufacturing requirements. For example, the M0 conductors along tracks M0_1, M0_3, M0_5 belong to one mask, whereas the M0 conductors along tracks M0_2, M0_4 belong to another mask. Other configurations are within the scopes of various embodiments, as described herein.

The M0 conductors overlap and are electrically coupled to underlying gate regions or MD contact structures by corresponding VG vias or VD vias into one or more meandering shapes to configure resistance of the resistor cell 900. For example, as shown by various arrows in FIG. 9, M0 conductor 942, gate region 913, M0 conductor 950, gate region 912, M0 conductor 941, gate region 911, M0 conductor 949, gate region 910, M0 conductor 940 are sequentially and serially coupled with each other by corresponding VG vias to form a first meandering shape 955. For another example as shown by various arrows in FIG. 9, M0 conductor 943, MD contact structure 930, M0 conductor 946, MD contact structure 931, M0 conductor 944, MD contact structure 932, M0 conductor 947, MD contact structure 933, M0 conductor 945, MD contact structure 934, M0 conductor 948 are sequentially and serially coupled with each other by corresponding VD vias to form a second meandering shape 956. The described meandering shapes are examples. Other arrangements and/or connections of various numbers of gate regions, MD contact structures, M0 conductors to form resistive structures are within the scopes of various embodiments.

In some embodiments, the meandering shapes 955, 956 of multiple instances of the resistor cell 900 are coupled to each other when the multiple instances of the resistor cell 900 are placed in abutment along corresponding boundary edges, and/or by one or more M1 conductor and corresponding V0 vias. An example M1 conductor 960 and corresponding V0 vias 961, 962 are illustrated in FIG. 9 as being usable to couple the meandering shapes 955, 956 when one end of M1 conductor 960 and V0 via 961 are arranged over M0 conductor 942, and the other end of M1 conductor 960 and V0 via 962 are arranged over M0 conductor 948. The higher the number of instances of the resistor cell 900 coupled together, the higher the resistance of the resistor (e.g., resistor R1, resistor R2, or the like) being built by the resistor cell 900. In some embodiments, an instance of the resistor cell 900 with a width of 5 CPP along the X-axis provides resistance from 15 kΩ to 18 kΩ, resulting in high resistance efficiency of about 280 kΩ/$\mu m^2$. As a result, it is possible in one or more embodiments to provide a BIST circuit within a limited area, e.g., of 3 $\mu m^2$ or less, as described with respect to a non-limiting example in FIG. 10B. One or more advantages described herein are achievable by a BIST circuit comprising a resistor built from one or more instances of the resistor cell 900 or the like, and/or by an IC device comprising such BIST circuit, in accordance with some embodiments.

Figure 10B:
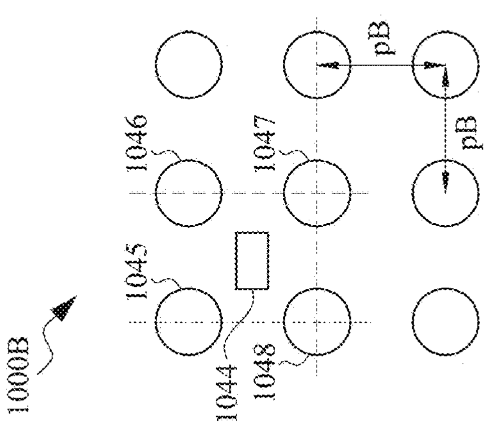
FIG. 10B is a schematic plan view of a region of an IC device, in accordance with some embodiments.
Figure 10A:
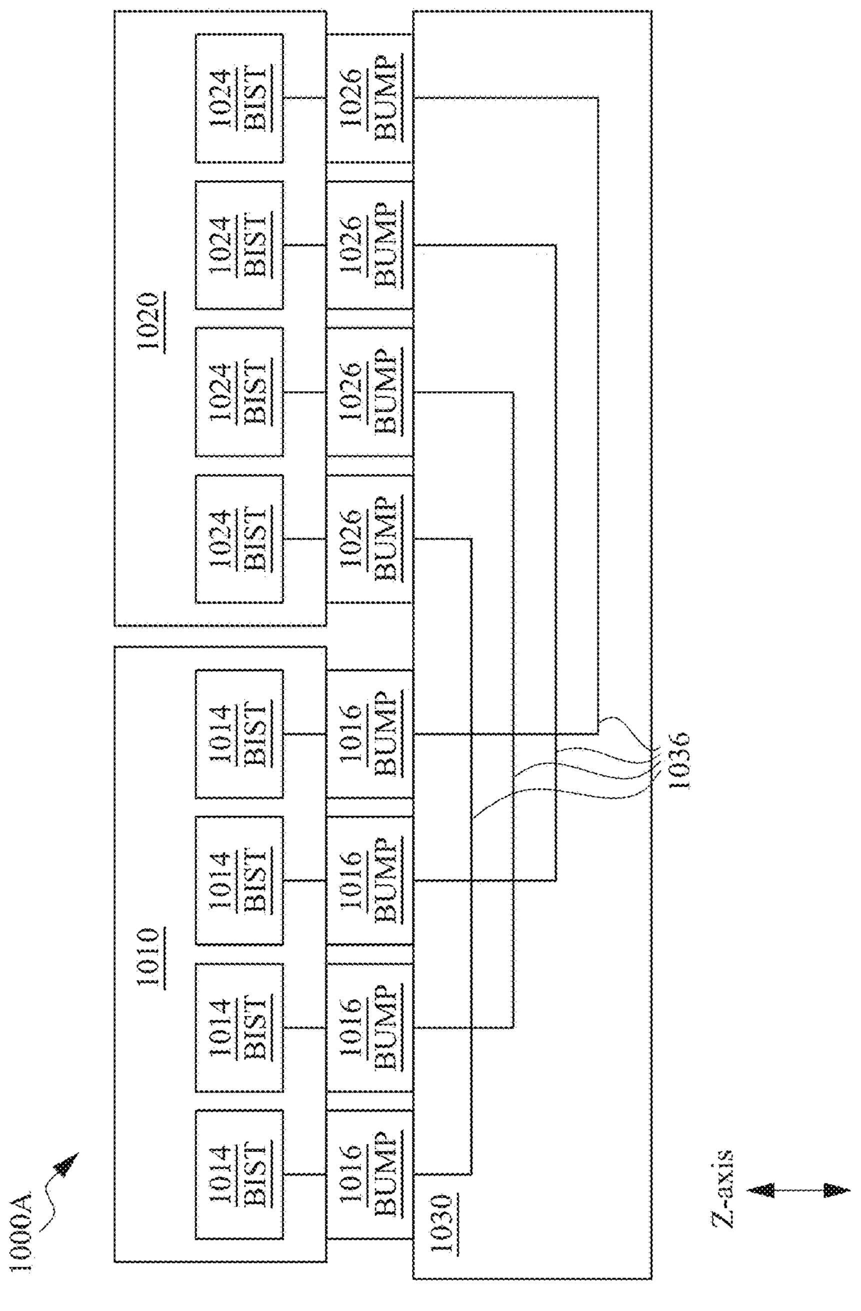
FIG. 10A is schematic diagram of a semiconductor device, in accordance with some embodiments.

FIG. 10A is schematic diagram of a semiconductor device 1000A, in accordance with some embodiments.

The semiconductor device 1000A is a 3D IC and comprises IC devices 1010, 1020 stacked along a Z axis on, and coupled to, an interposer 1030. The IC device 1010 comprises a plurality of I/O circuits (not shown) with corresponding BIST circuits 1014. I/O terminal PADs of the I/O circuits corresponding to the BIST circuits 1014 are coupled and bonded by bumps 1016 to corresponding interconnects 1036 in the interposer 1030. The IC device 1020 comprises a plurality of I/O circuits (not shown) with corresponding BIST circuits 1024. I/O terminal PADs of the I/O circuits corresponding to the BIST circuits 1024 are coupled and bonded by bumps 1026 to corresponding interconnects 1036 in the interposer 1030, to be thereby coupled to the corresponding I/O terminal PADs of the I/O circuits of the IC device 1010. As a result, the IC device 1010 is coupled by the bumps 1016, 1026 and the interposer 1030 to the IC device 1020. The described 3D IC configuration is an example. Other 3D IC configurations are within the scopes of various embodiments.

In some embodiments, the semiconductor device 1000A corresponds to the semiconductor device 100, the IC devices 1010, 1020 correspond to IC devices 110, 120, a combination of each bump 1016, the corresponding interconnect 1036 and the corresponding bump 1026 correspond to the interface structure 130. In the example configuration in FIG. 10A, each of the IC devices 1010, 1020 comprises a BIST circuit 1014, 1024 for each corresponding bump 1016, 1026, i.e., with a 1:1 ratio. In some embodiments, at least one of the IC devices 1010, 1020 exhibits a ratio between a number of bumps 1016, 1026 and a number of BIST circuits 1014, 1024 other than 1:1. In at least one embodiment, the BIST circuits 1024, 1026 are configured and/or operated as described with respect to FIGS. 2-9. One or more advantages described herein are achievable by the semiconductor device 1000A, in accordance with some embodiments.

FIG. 10B is a schematic plan view of a region of an IC device 1000B, in accordance with some embodiments. In at least one embodiment, the IC device 1000B corresponds to one or more of the IC devices 1010, 1020.

The schematic plan view in FIG. 10B shows an arrangement of bumps of the IC device 1000B. For simplicity, some of the bumps are given reference numerals 1045-1048, whereas reference numerals are omitted for the other bumps. In at least one embodiment, the bumps of IC device 1000B correspond to the bumps 1016 and/or the bumps 1026. The bumps of IC device 1000B are arranged at a center-to-center pitch of pB in two perpendicular directions. In some embodiments, at advanced technology nodes, pB is between 6 μm and 9 μm.

The IC device 1000B comprises a BIST circuit 1044 which corresponds to one or more of the BIST circuits described with respect to one or more of FIGS. 2-10A. The BIST circuit 1044 is completely arranged within a boundary defined by center-to-center lines that connect the centers of immediately adjacent bumps 1045-1048. In the plan view in FIG. 10B, the BIST circuit 1044 does not overlap the bumps 1045-1048. In some embodiments, the BIST circuit 1044 is completely arranged within this limited area of 3 $\mu m^2$ or less, while being configured to detect sub-μA leakage currents. One or more advantages described herein are achievable by the semiconductor device 1000B, in accordance with some embodiments.

Figure 10C:
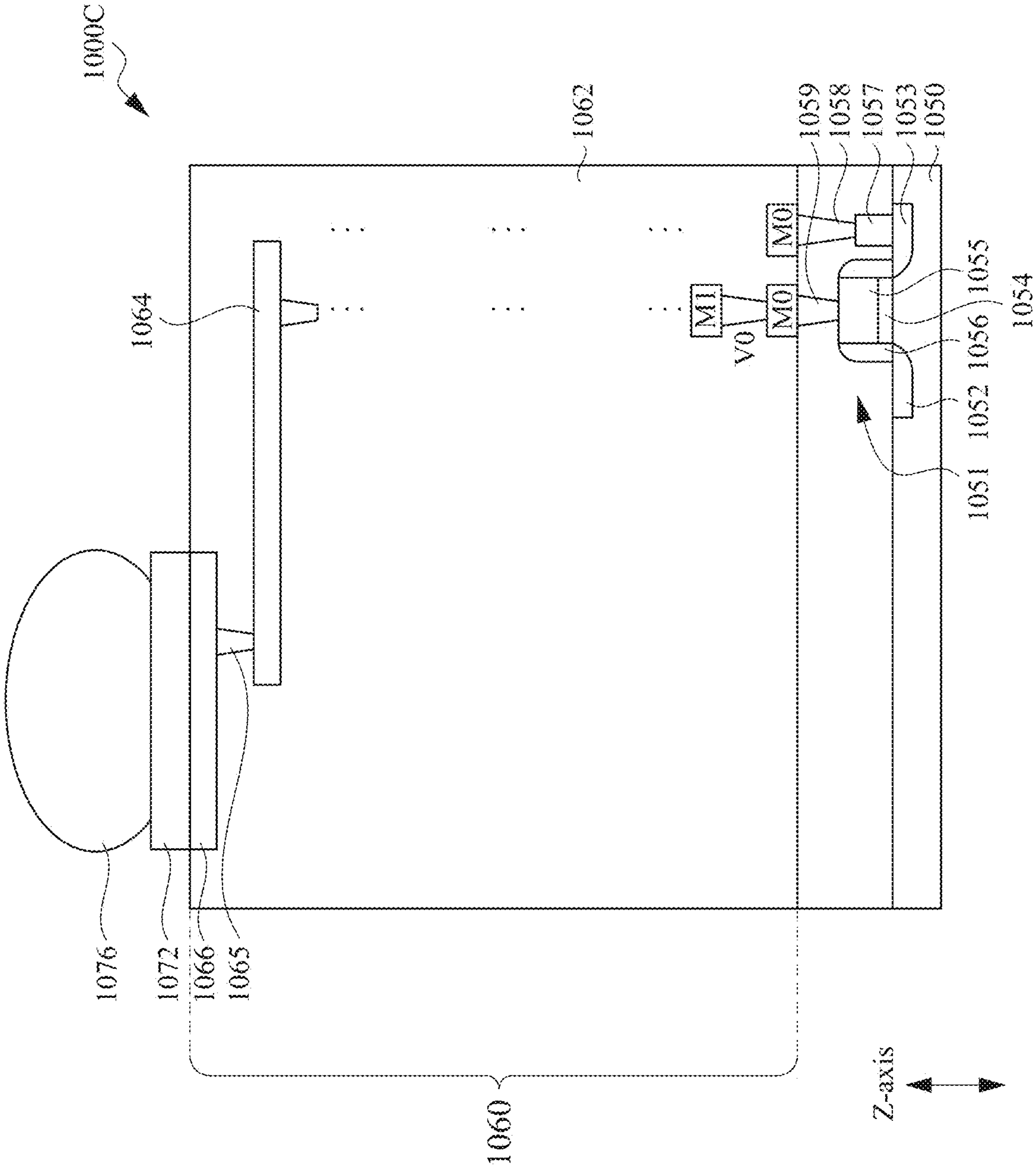
FIG. 10C is a schematic cross-sectional view of an IC device, in accordance with some embodiments.

FIG. 10C is a schematic cross-sectional view of a portion of an IC device 1000C, in accordance with some embodiments. In some embodiments, the IC device 1000C corresponds to one or more of IC devices described with respect to one or more of FIGS. 1, 6A-8C, 10A-10B.

The IC device 1000C comprises a substrate 1050 over which circuitry of the IC device 1000C is formed. The circuitry of the IC device 1000C includes functional circuits, I/O circuits, BIST circuits, resistive regions corresponding to resistor cells, or the like. The circuitry comprises a plurality of circuit elements electrically coupled together to perform one or more operations. In FIG. 10C, a transistor 1051 is illustrated as an example circuit element of the circuitry of the IC device 1000C. The transistor 1051 comprises source/drain regions 1052, 1053 which are P-doped or N-doped regions formed by P-type or N-type dopants added to the substrate 1050. In some embodiments, P-doped or N-doped regions are formed in N-wells or P-wells. In some embodiments, isolation structures are formed between adjacent P well/P-doped regions and N well/N-doped regions. For simplicity, isolation structures are omitted from FIG. 10C. The transistor 1051 further comprises a gate stack including a gate dielectric layer 1054, and a gate electrode 1055. In at least one embodiment, the gate dielectric layer comprises multiple gate dielectric layers. Example materials of the gate dielectric layer or layers include $HfO_2$, $ZrO_2$, or the like. Example materials of the gate electrode 1055 include polysilicon, metal, or the like. Spacers 1056 are formed on sidewalls of the gate stack. Example materials of the spacers 1056 include, but are not limited to, silicon nitride, oxynitride, silicon carbide, or the like. Contact structures, such as metal-to-device (MD) contact structures, are formed over the source/drain regions of the transistor 1051 to define an electrical connection from the transistor 1051 to other circuit elements. In FIG. 10C, an MD contact structure 1057 is illustrated as being over and electrically coupled to the source/drain region 1053. A via-to-device (VD) via 1058 is over and in electrical contact with the MD contact structure 1057. A via-to-gate (VG) via 1059 is over and in electrical contact with the gate electrode 1055. An example material of the VD and VG vias includes metal.

The IC device 1000C further comprises a redistribution layer 1060 over the substrate 1050 along a thickness direction of the substrate 1050, which is indicated as Z-axis in FIG. 10C. The redistribution layer 1060 comprises a plurality of metal layers and via layers sequentially and alternatingly arranged over the VD, VG vias along the Z-axis. The redistribution layer 1060 further comprises an interlayer dielectric (ILD) 1062 in which the metal layers and via layers are embedded. In the example configuration in FIG. 10C, the circuitry represented by the transistor 1051 is coupled to each other by various metal layers and via layers, and also to a conductive pattern 1064 adjacent the top of the redistribution layer 1060, then to a via 1065, and then to a contact pad 1066. Example materials of the contact pad 1066 include, but are not limited to, aluminum, copper, silver, gold, tungsten, nickel, alloys thereof, multi-layers thereof, or the like.

A under-bump-metallurgy (UBM) structure 1072 is over and in electrical contact with the contact pad 1066. The UBM structure 1072 is configured to receive a bump 1076 for physically and electrically coupling the IC device 1000C to another device, e.g., an interconnect structure, interposer, another die, or the like. Example materials of the UBM structure 1072 include, but are not limited to, one or more layers of copper, tantalum, titanium, nickel, copper, alloys thereof, or the like. Example materials of the bump 1076 include, but are not limited to, one or more layers of solder, tin, lead, copper, gold, silver, zinc, bismuth, magnesium, antimony, indium, alloys thereof, or the like. In some embodiments, the IC device 1000C further comprises a passivation layer (not shown) in which the contact pad 1066 and/or the UBM structure 1072 is/are partially embedded. Example materials of the passivation layer include, but are not limited to, silicon nitride (SiN), silicon dioxide ($SiO_2$), silicon oxynitride (SiON), un-doped silicate glass (USG), polymer, multi-layers thereof, or the like. Example polymers include, but are not limited to, epoxy, polyimide, benzocyclobutene (BCB), polybenzoxazole (PBO), multi-layers thereof, or the like. In some embodiments, the bump 1076 corresponds to one or more of the bumps 1016, 1026, 1045-1048 described herein.

Figure 11A:
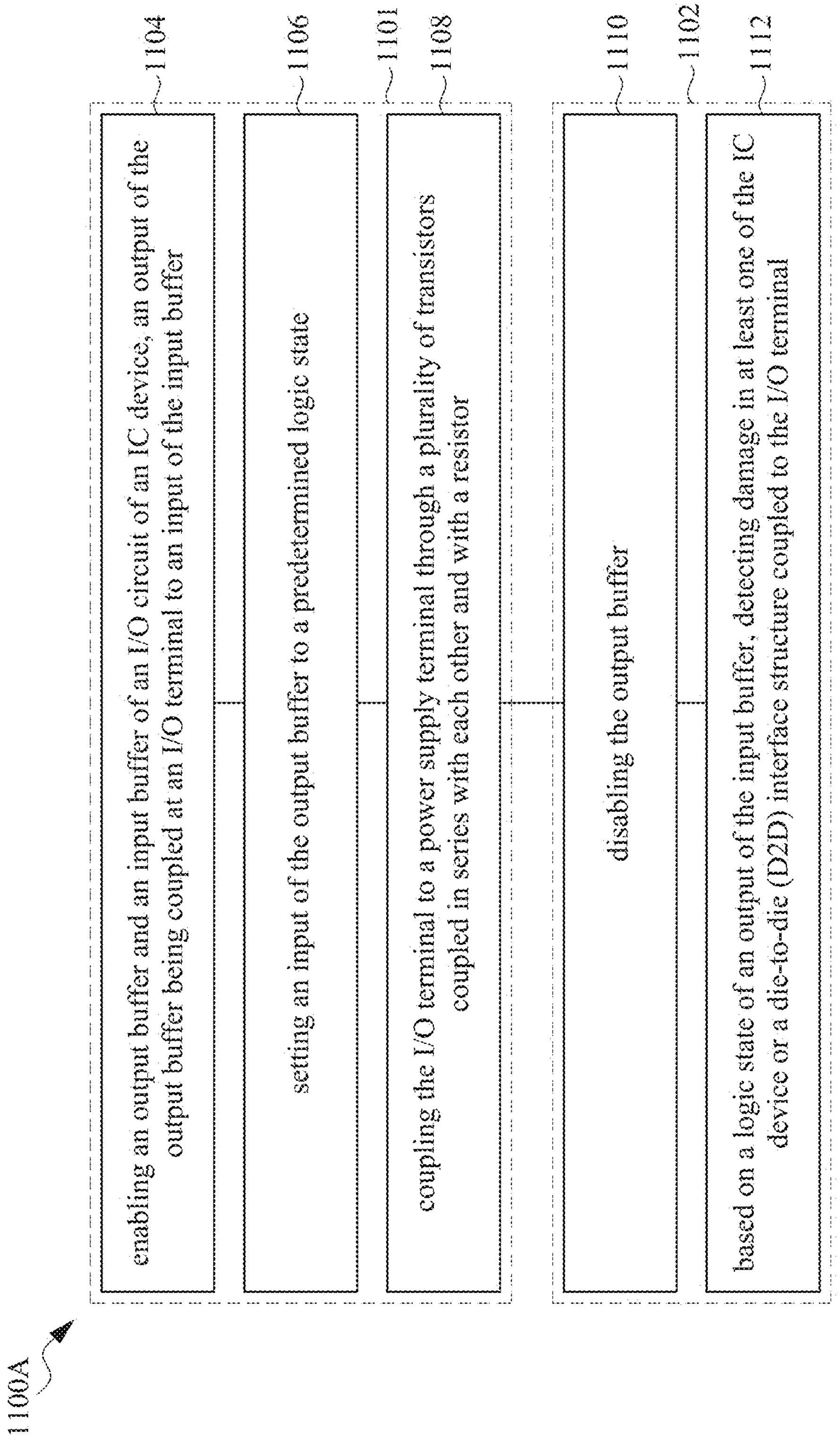
FIGS. 11A-11C are flowcharts of various methods, in accordance with some embodiments.

FIG. 11A is a flow chart of a method 1100A, in accordance with some embodiments. In some embodiments, the method 1100A is a method of performing a BIST operation. The method 1100A comprises a first stage 1101, and a second stage 1102. The first stage 1101 comprises operations 1104, 1106, 1108. The second stage 1102 comprises operations 1110, 1112.

At operation 1104, an output buffer and an input buffer of an input/output (I/O) circuit of an IC device are enabled, wherein an output of the output buffer is coupled at an I/O terminal to an input of the input buffer. For example, as described with respect to FIG. 5B (or FIG. 5C), during a first stage between timing t1 (or timing t11) and timing t2 (or timing t12), output buffer Tx and input buffer Rx of an I/O circuit are enabled by corresponding output enable signal OE and input enable signal IE both having logic "1". As described with respect to FIG. 5A, an output of output buffer Tx is coupled at I/O terminal PAD to an input of input buffer Rx.

At operation 1106, an input of the output buffer is set to a predetermined logic state. For example, as described with respect to FIGS. 5B-5C, an input of output buffer Tx is set to logic "0" (FIG. 5B) or logic "1" (FIG. 5C) by a corresponding logic state at node CSO.

At operation 1108, the I/O terminal is coupled to a first power supply terminal through a plurality of transistors coupled in series with each other and with a resistor. For example, as described with respect to FIG. 5A, when switch SW2 is closed, I/O terminal PAD is coupled to VSS through a plurality of transistors MN1, MN2 to MNn coupled in series with each other and with a resistor R2, for a P-side checking BIST operation described with respect to FIG. 5B. Alternatively, when switch SW1 is closed, I/O terminal PAD is coupled to VDD through a plurality of transistors MP1, MP2 to MPm coupled in series with each other and with a resistor R1, for an N-side checking BIST operation described with respect to FIG. 5C.

At operation 1110, the output buffer is disabled. For example, as described with respect to FIGS. 5B-5C, output buffer Tx is disabled when output enable signal OE is switched to logic "0" at timing t2 (FIG. 5B) or timing t12 (FIG. 5C).

At operation 1112, based on a logic state of an output of the input buffer, damage is detected in at least one of the IC device or a die-to-die (D2D) interface structure coupled to the I/O terminal. For example, as described with respect to FIGS. 5B-5C, when a logic state of node CSI at an output of input buffer Rx is changed from one logic state to a different logic state, a control circuit determines that corresponding damage exists. More specifically, P-side damage is detected when the logic state of node CSI is changed from logic "0" to logic "1" (FIG. 5B), or N-side damage is detected when the logic state of node CSI is changed from logic "1" to logic "0" (FIG. 5C). As described with respect to FIGS. 5A, 6A-6B, 7A-7B, it is possible to detect damage in the IC device itself, and/or in a interface structure 630, 730 coupled to I/O terminal PAD. One or more advantages described herein are achievable by the method 1100A, in accordance with some embodiments.

Figure 11B:
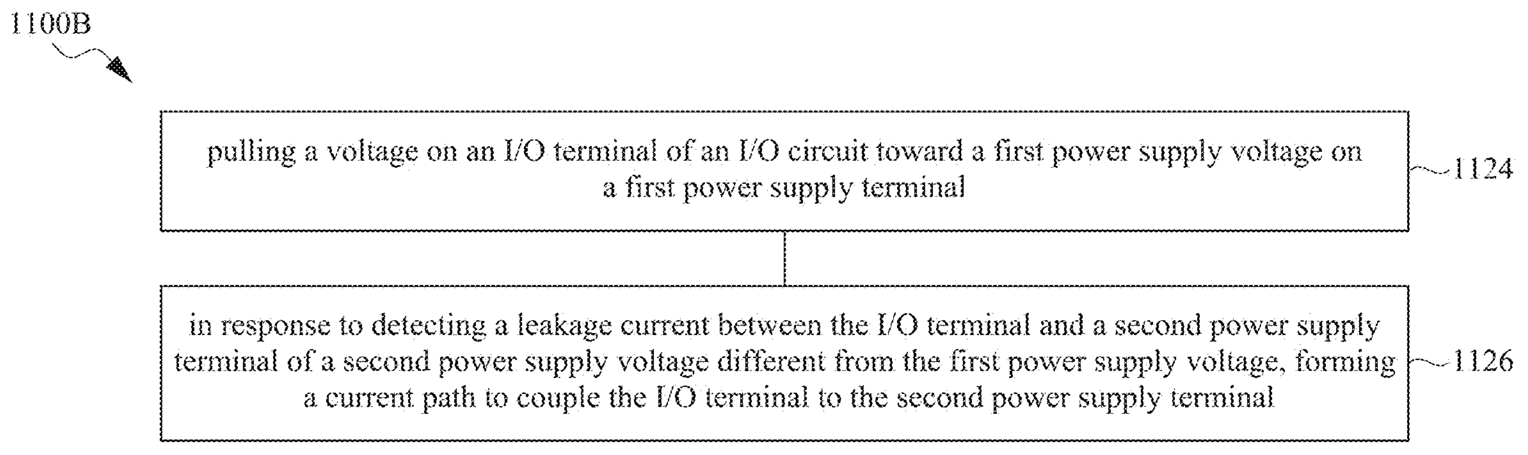

FIG. 11B is a flow chart of a method 1100B, in accordance with some embodiments. In some embodiments, the method 1100B is a method of performing a BIST operation. The method 1100B comprises operations 1124, 1126.

At operation 1124, a voltage on an I/O terminal of an I/O circuit is pulled toward a first power supply voltage on a first power supply terminal. For example, as described with respect to FIGS. 4A-4B, a voltage on I/O terminal PAD of an I/O circuit is pulled toward VSS (FIG. 4A) or VDD (FIG. 4B).

At operation 1126, in response to detecting a leakage current between the I/O terminal and a second power supply terminal of a second power supply voltage different from the first power supply voltage, a current path is formed to couple the I/O terminal to the second power supply terminal. For example, as described with respect to FIG. 4A, in response to detecting a leakage current ($I_{LP}>I_{PD}$) between I/O terminal PAD and VDD, a current path 435 is formed to couple I/O terminal PAD to VDD. Alternatively, as described with respect to FIG. 4B, in response to detecting a leakage current ($I_{LN}>I_{PU}$) between I/O terminal PAD and VSS, a current path 445 is formed to couple I/O terminal PAD to VSS. One or more advantages described herein are achievable by the method 1100B, in accordance with some embodiments.

Figure 11C:
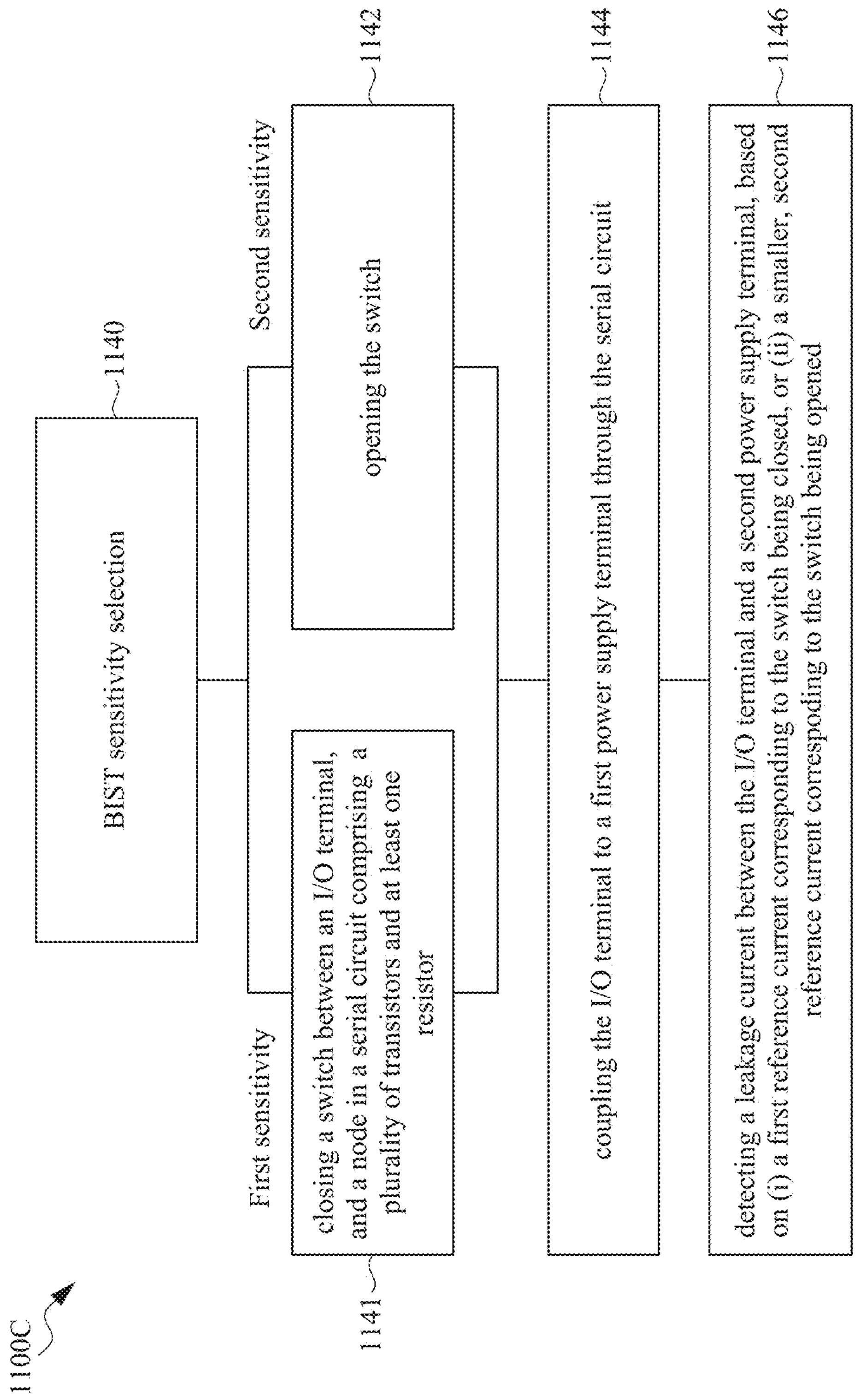

FIG. 11C is a flow chart of a method 1100C, in accordance with some embodiments. In some embodiments, the method 1100C is a method of performing a BIST operation. The method 1100C comprises operations 1140, 1141, 1142, 1144, 1146.

At operation 1140, a BIST sensitivity of a BIST circuit is selected. For example, a higher BIST sensitivity is selected when leakage currents and/or damage are to be detected with a smaller reference current, whereas a lower BIST sensitivity is selected when leakage currents and/or damage are to be detected with a higher reference current. In at least one embodiment, the BIST sensitivity selection is performed by a control circuit of the BIST circuit. Other arrangements are within the scopes of various embodiments. For example, BIST sensitivity is selectable by a circuit outside the BIST circuit, by testing equipment, or by a human operator.

At operation 1141, in response to a first BIST sensitivity being selected, a switch between an I/O terminal, and a node in a serial circuit comprising a plurality of transistors and at least one resistor is closed. For example, as described with respect to FIGS. 8A-8C, a switch 161 is closed, wherein the switch 861 is between I/O terminal PAD, and a node 851 in a serial circuit, i.e., pull-down circuit 820, 825, comprising a plurality of transistors MN1, MN2 to MNn and at least one resistor R81, R82.

At operation 1142, in response to a higher, second BIST sensitivity being selected, the switch is opened. For example, as described with respect to FIGS. 8A-8C, the switch 161 is opened for a higher BIST sensitivity.

At operation 1144, the I/O terminal is coupled to a first power supply terminal through the serial circuit. For example, as described with respect to FIGS. 8A-8C, I/O terminal PAD is coupled to VSS through the pull-down circuit 820, 825 when another switch SW2 is closed.

At operation 1146, a leakage current between the I/O terminal and a second power supply terminal is detected, based on (i) a first reference current corresponding to the switch being closed, or (ii) a smaller, second reference current corresponding to the switch being opened. For example, as described with respect to FIGS. 8A-8C, a first reference current corresponding to the switch 861 being closed is higher than a second reference current corresponding to the switch 861 being opened, because the total resistance of the serial circuit is smaller when the switch 861 is closed than when the switch 861 is opened. As described with respect to FIG. 3B, a reference current $I_{PD}$, being the first or second reference current, is used as the basis for detecting a leakage current $I_{LP}$. One or more advantages described herein are achievable by the method 1100C, in accordance with some embodiments.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a built-in self-test (BIST) circuit comprises a first switch, a first resistor, at least one first transistor, and a control circuit. The first switch, the first resistor and the at least one first transistor are coupled in series between a first power supply terminal of a first power supply voltage and an input/output (I/O) terminal of an I/O circuit. The control circuit is configured to, in a first BIST operation, close the first switch and, while the first switch is being closed, detect a first leakage current between the I/O terminal and a second power supply terminal of a second power supply voltage different from the first power supply voltage.

In some embodiments, an integrated circuit (IC) device comprises an input/output (I/O) circuit having an I/O terminal, and a built-in self-test (BIST) circuit comprising a first circuit and a first detection assist circuit. The first circuit is coupled between the I/O terminal and a first power supply terminal. The first circuit is configured to, in a first BIST operation, pull a voltage on the I/O terminal toward a first power supply voltage on the first power supply terminal. The first detection assist circuit is coupled to the I/O terminal and a second power supply terminal of a second power supply voltage different from the first power supply voltage. The first detection assist circuit is configured to, in the first BIST operation, in response to a first leakage current flowing between the I/O terminal and the second power supply terminal, form a first current path through the first detection assist circuit to couple the I/O terminal to the second power supply terminal.

In some embodiments, a method comprises a first stage and a second stage, subsequent to the first stage, of a built-in self-test (BIST) operation of a first integrated circuit (IC) device. The first stage comprises enabling an output buffer and an input buffer of an input/output (I/O) circuit of the first IC device, wherein an output of the output buffer is coupled at an I/O terminal to an input of the input buffer, setting an input of the output buffer to a predetermined logic state, and coupling the I/O terminal to a first power supply terminal through a plurality of transistors coupled in series with each other and with a resistor. The second stage comprises disabling the output buffer, and based on a logic state of an output of the input buffer, detecting damage in at least one of the first IC device or a die-to-die (D2D) interface structure coupled to the I/O terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A built-in self-test (BIST) circuit, comprising:
a first switch;
a first resistor;
at least one first transistor; and
a control circuit,
wherein
the first switch, the first resistor and the at least one first transistor are coupled in series between a first power supply terminal of a first power supply voltage and an input/output (I/O) terminal of an I/O circuit, and
the control circuit is configured to, in a first BIST operation,
close the first switch, and
while the first switch is being closed, detect a first leakage current between the I/O terminal and a second power supply terminal of a second power supply voltage different from the first power supply voltage.

2. The BIST circuit of claim 1, wherein
the I/O circuit comprises an output buffer and an input buffer, an output of the output buffer being coupled at the I/O terminal to an input of the input buffer, and
the control circuit is configured to, while the first switch is being closed, detect the first leakage current based on a logic state of an output of the input buffer.

3. The BIST circuit of claim 1, further comprising:
a bias voltage generation circuit configured to supply a bias voltage to a gate of the at least one first transistor to configure the at least one first transistor operable at a direct current (DC) operating point.

4. The BIST circuit of claim 1, wherein
the first resistor is coupled to a source of the at least one first transistor to configure a source degeneration arrangement.

5. The BIST circuit of claim 1, wherein
the at least one first transistor comprises a plurality of first transistors coupled in series into a first transistor string,
gates of the plurality of first transistors are coupled together and configured to receive a first bias voltage to configure the plurality of first transistors operable at a first direct current (DC) operating point,
a source of a first transistor at a first end of the first transistor string is coupled to a first end of the first resistor,
a drain of a further first transistor at a second end of the first transistor string is coupled to the I/O terminal, and
a second end of the first resistor is coupled by the first switch to the first power supply terminal.

6. The BIST circuit of claim 5, further comprising:
a second switch;
a second resistor; and
a plurality of second transistors coupled in series into a second transistor string,
wherein
gates of the plurality of second transistors are coupled together and configured to receive a second bias voltage to configure the plurality of second transistors operable at a second DC operating point,
a source of a second transistor at a first end of the second transistor string is coupled to a first end of the second resistor,
a drain of a further second transistor at a second end of the second transistor string is coupled to the I/O terminal, a second end of the second resistor is coupled by the second switch to the second power supply terminal, the control circuit is configured to, in the first BIST operation, open the second switch, and the control circuit is further configured to, in a second BIST operation, open the first switch, close the second switch, and while the second switch is being closed, detect a second leakage current between the I/O terminal and the first power supply terminal.

7. The BIST circuit of claim 6, further comprising:

a first detection assist circuit coupled to the I/O terminal and the second power supply terminal, the first detection assist circuit configured to, in the first BIST operation, in response to the first leakage current flowing between the I/O terminal and the second power supply terminal, form a first current path through the first detection assist circuit to couple the I/O terminal to the second power supply terminal, and a second detection assist circuit coupled to the I/O terminal and the first power supply terminal, the second detection assist circuit configured to, in the second BIST operation, in response to the second leakage current flowing between the I/O terminal and the first power supply terminal, form a second current path through the second detection assist circuit to couple the I/O terminal to the first power supply terminal.

8. The BIST circuit of claim 7, wherein the second power supply voltage is lower than the first power supply voltage, and at least one of the first detection assist circuit comprises:

first and second N-type transistors coupled in series between the second power supply terminal and the I/O terminal, and a NAND gate having an input coupled to the I/O terminal, and an output coupled to a gate of the second N-type transistor, or the second detection assist circuit comprises:

first and second P-type transistors coupled in series between the first power supply terminal and the I/O terminal, and a NOR gate having an input coupled to the I/O terminal, and an output coupled to a gate of the second P-type transistor.

9. The BIST circuit of claim 1, further comprising:

a second switch coupled between the I/O terminal, and a node between the at least one first transistor and at least a portion of the first resistor, wherein the control circuit is configured to close the second switch in the first BIST operation to detect the first leakage current with a first reference current, and open the second switch in the first BIST operation to detect the first leakage current with a second reference current smaller than the first reference current.

10. The BIST circuit of claim 1, wherein the at least one first transistor comprises a plurality of first transistors coupled in series, the BIST circuit further comprising:

a second switch coupled between the I/O terminal, and a node between two adjacent first transistors among the plurality of first transistors, wherein the control circuit is configured to close the second switch in the first BIST operation to detect the first leakage current with a first reference current, and open the second switch in the first BIST operation to detect the first leakage current with a second reference current smaller than the first reference current.

11. An integrated circuit (IC) device, comprising:

an input/output (I/O) circuit having an I/O terminal; and a built-in self-test (BIST) circuit comprising a first circuit and a first detection assist circuit, wherein the first circuit is coupled between the I/O terminal and a first power supply terminal, the first circuit configured to, in a first BIST operation, pull a voltage on the I/O terminal toward a first power supply voltage on the first power supply terminal, and the first detection assist circuit is coupled to the I/O terminal and a second power supply terminal of a second power supply voltage different from the first power supply voltage, the first detection assist circuit configured to, in the first BIST operation, in response to a first leakage current flowing between the I/O terminal and the second power supply terminal, form a first current path through the first detection assist circuit to couple the I/O terminal to the second power supply terminal.

12. The IC device of claim 11, wherein the first detection assist circuit comprises:

a transistor coupled between the second power supply terminal and the I/O terminal, the transistor configured to form at least a part of the first current path upon being turned ON, and a logic circuit having an input coupled to the I/O terminal, and an output coupled to a gate of the transistor.

13. The IC device of claim 12, wherein the logic circuit is configured to, in the first BIST operation and in response to a value of the first leakage current exceeding a first threshold, turn ON the transistor to form the first current path to couple the I/O terminal to the second power supply terminal.

14. The IC device of claim 11, wherein the second power supply voltage is lower than the first power supply voltage, and the first detection assist circuit comprises:

first and second N-type transistors coupled in series between the second power supply terminal and the I/O terminal, and a NAND gate having an input coupled to the I/O terminal, and an output coupled to a gate of the second N-type transistor.

15. The IC device of claim 11, wherein the second power supply voltage is higher than the first power supply voltage, and the first detection assist circuit comprises:

first and second P-type transistors coupled in series between the second power supply terminal and the I/O terminal, and a NOR gate having an input coupled to the I/O terminal, and an output coupled to a gate of the second P-type transistor.

16. The IC device of claim 11, wherein the BIST circuit further comprises:

a second circuit coupled between the I/O terminal and the second power supply terminal, the second circuit configured to, in a second BIST operation, pull the voltage on the I/O terminal toward the second power supply voltage on the second power supply terminal, and a second detection assist circuit coupled to the I/O terminal and the first power supply terminal, the second detection assist circuit configured to, in the second BIST operation, in response to a second leakage current flowing between the I/O terminal and the first power supply terminal, form a second current path through the second detection assist circuit to couple the I/O terminal to the first power supply terminal.

17. A method, comprising:

during a first stage of a built-in self-test (BIST) operation of a first integrated circuit (IC) device, enabling an output buffer and an input buffer of an input/output (I/O) circuit of the first IC device, an output of the output buffer being coupled at an I/O terminal to an input of the input buffer, setting an input of the output buffer to a predetermined logic state, and coupling the I/O terminal to a first power supply terminal through a plurality of transistors coupled in series with each other and with a resistor; and during a second stage of the BIST operation, the second stage subsequent to the first stage, disabling the output buffer, and based on a logic state of an output of the input buffer, detecting damage in at least one of the first IC device or a die-to-die (D2D) interface structure coupled to the I/O terminal.

18. The method of claim 17, further comprising:

in response to a value of a leakage current between the I/O terminal and a second power supply terminal exceeding a threshold, forming a current path to couple the I/O terminal to the second power supply terminal.

19. The method of claim 17, further comprising:

upon expiration of a predetermined time period from said disabling the output buffer, obtaining the logic state of the output of the input buffer for said detecting damage.

20. The method of claim 17, further comprising:

during the BIST operation of the first IC device, disabling a further output buffer and a further input buffer of a further I/O circuit of a second IC device, an output of the further output buffer being coupled at a further I/O terminal to an input of the further input buffer, the further I/O terminal coupled to the I/O terminal through the D2D interface structure, and disabling a BIST circuit of the second IC device, the BIST circuit coupled to the further I/O terminal.

* * * * *